(12) United States Patent
Song et al.

(10) Patent No.: US 10,079,361 B2
(45) Date of Patent: Sep. 18, 2018

(54) LIGHTING APPARATUS USING ORGANIC LIGHT-EMITTING DIODE AND METHOD OF FABRICATING THE SAME

(71) Applicant: LG Display Co., Ltd., Seoul (KR)

(72) Inventors: Taejoon Song, Paju-si (KR); Namkook Kim, Suwon-si (KR); Shinbok Lee, Seoul (KR); Soonsung Yoo, Goyang-si (KR); Hwankeon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/699,840

(22) Filed: Sep. 8, 2017

(65) Prior Publication Data
US 2018/0159071 A1  Jun. 7, 2018

(30) Foreign Application Priority Data
Dec. 7, 2016  (KR) .................. 10-2016-0166041

(51) Int. Cl.
*H01L 51/10*   (2006.01)
*H01L 51/52*   (2006.01)
(Continued)

(52) U.S. Cl.
CPC ...... *H01L 51/5246* (2013.01); *H01L 51/0097* (2013.01); *H01L 51/56* (2013.01); *H01L 51/0017* (2013.01); *H01L 51/0021* (2013.01); *H01L 51/102* (2013.01); *H01L 51/5203* (2013.01); *H01L 2251/5338* (2013.01); *H01L 2251/5361* (2013.01)

(58) Field of Classification Search
CPC ............. H01L 51/0017; H01L 51/0021; H01L 51/102; H01L 51/5203

USPC ............................................... 438/42; 257/99
See application file for complete search history.

(56) References Cited

U.S. PATENT DOCUMENTS

2004/0007707 A1*  1/2004  Wirth ............... H01L 33/22
                                                                257/79
2007/0228942 A1*  10/2007  Akai ................ H01L 51/5234
                                                               313/504
(Continued)

FOREIGN PATENT DOCUMENTS

| EP | 2 787 793 A1 | 10/2014 |
| WO | 2015/174154 A1 | 11/2015 |

OTHER PUBLICATIONS

Extended European Search Report dated May 2, 2018 in a counterpart application EP 17 20 4630.2.

*Primary Examiner* — George Fourson, III
(74) *Attorney, Agent, or Firm* — Polsinelli PC

(57) ABSTRACT

A lighting apparatus using an organic light-emitting diode and a method of fabricating the same are characterized in that an organic emissive material and a conductive film used as a cathode are deposited on the entire surface of a substrate, and then an organic emissive layer in a lighting area and contact areas becomes separated (disconnected or cut) by laser ablation, simultaneously with the formation of a contact hole for contact with an anode. Next, cathode contact and encapsulation processes are performed using an adhesive containing conductive particles and a metal film. This simplifies the fabrication process of the lighting apparatus without using an open mask (metal mask), which is a complicated tool, thus making it useful especially in roll-to-roll manufacturing.

20 Claims, 23 Drawing Sheets

(51) Int. Cl.
*H01L 51/00* (2006.01)
*H01L 51/56* (2006.01)

(56) References Cited

U.S. PATENT DOCUMENTS

| | | |
|---|---|---|
| 2011/0001146 A1 | 1/2011 | Yamazaki et al. |
| 2014/0239262 A1* | 8/2014 | Kim .................... H01L 51/5212 257/40 |
| 2014/0346459 A1* | 11/2014 | Song .................. H01L 51/5228 257/40 |
| 2014/0353609 A1* | 12/2014 | Song .................. H01L 27/3276 257/40 |
| 2016/0149155 A1* | 5/2016 | Kim .................... H01L 51/5228 257/40 |
| 2016/0172618 A1 | 6/2016 | Chen et al. |
| 2017/0069696 A1* | 3/2017 | Kondo ................ H01L 27/3276 |
| 2017/0092891 A1 | 3/2017 | Tanaka |
| 2018/0019380 A1* | 1/2018 | Kim ........................ H01L 33/44 |

* cited by examiner

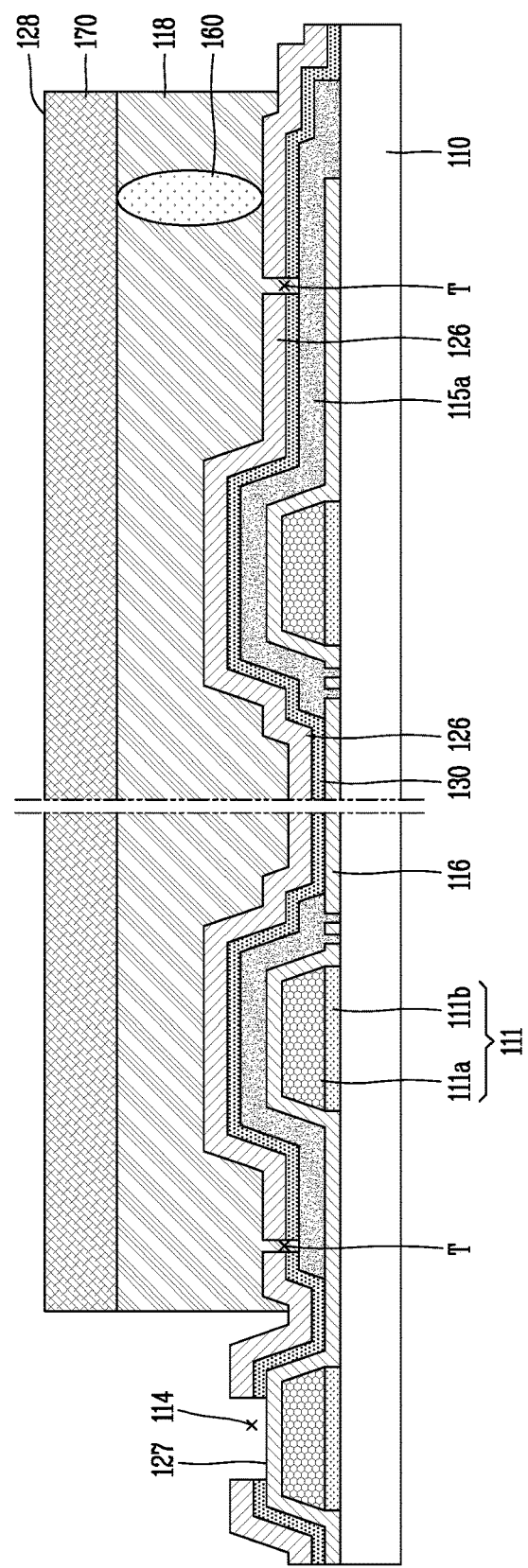

LIGHTING APPARATUS USING ORGANIC LIGHT-EMITTING DIODE AND METHOD OF FABRICATING THE SAME

CROSS-REFERENCE TO RELATED APPLICATION

Pursuant to 35 U.S.C. § 119(a), this application claims the benefit of earlier filing date and right of priority to Korean Application No. 10-2016-0166041, filed on Dec. 7, 2016, the contents of which is incorporated by reference herein in its entirety.

BACKGROUND

Field of the Disclosure

The present disclosure relates to a lighting apparatus, and more particularly, to a lighting apparatus using an organic light-emitting diode and a method of fabricating the same. Although the present disclosure is suitable for a wide scope of applications, it is particularly suitable for a lighting apparatus using an organic light-emitting diode, which allows for a simplified fabrication process by patterning the organic light-emitting diode without using an open mask, and a method of fabricating the same.

Description of the Background

Common lighting apparatuses currently being used include fluorescent lamps and incandescent lamps. The incandescent lamps have good color rendering index (CRI) but very low energy efficiency, and the fluorescent lamps have good efficiency but low color rendering index and contain mercury, posing environmental concerns.

A color rendering index, which indicates how accurately colors are reproduced, is a measure of the ability of a light source to reveal the color of an object faithfully in comparison with a reference light source. The CRI of sunlight is 100.

To resolve the problems with the conventional lighting apparatuses, light-emitting diodes (LEDs) are being proposed these days. However, the LEDs are made from inorganic emissive materials and have the highest luminous efficiency at blue wavelengths, and their luminous efficiency decreases towards red wavelengths and green wavelengths, which is where the eye is most sensitive. Thus, when a red LED, a green LED, and a blue LED combine to emit white light, the luminous efficiency is low.

Lighting apparatuses using an organic light-emitting diode (OLED) are being developed as another alternative. A typical lighting apparatus using an OLED has an anode made of ITO over a glass substrate. Then, an organic emissive layer and a cathode are formed, and a passivation layer and a laminate film are formed on top of them, followed by cover glass substrate attachment and encapsulation processes.

The deposition process of the organic emissive layer and the electrodes, which is the core process, is usually performed in high vacuum atmosphere, so it requires as many deposition chambers for maintaining high vacuum as there are thin films to be deposited.

In recent years, the use of flexible substrates instead of glass substrates is actively under research and development. In this case, a flexible substrate, usually wound on a roll, is installed on equipment - that is, roll-to-roll equipment for continuous feeding and deposition. However, this causes to increase in the total number of processes; especially, in the OLED process after the formation of the anode, the organic emissive layer, cathode, and passivation layer are deposited using different open masks (i.e., metal masks) for the different layers. After the deposition using open masks, a cleaning process is needed at every step, and the substrate and the open masks should be aligned with each other. A misalignment may create shadow and pattern tolerance, thereby leading to defects.

SUMMARY OF THE DISCLOSURE

The present disclosure is directed to solving the above-described problems, and an aspect of the present disclosure is to provide a lighting apparatus using an organic light-emitting diode, which allows for depositing an organic light-emitting diode without using an open mask (metal mask), and a method of fabricating the same.

These and other aspects and features of the present disclosure will become better understood with reference to the appended claims.

An exemplary aspect of the present disclosure provides a lighting apparatus using an organic light-emitting diode, including: a substrate divided into a lighting area and first and second contact areas, a first electrode on the substrate and a passivation layer on the first electrode.

The lighting apparatus using the organic light-emitting diode of the exemplary aspect of the present disclosure further includes an organic emissive layer and a second electrode on the entire surface of the substrate where the passivation layer is provided, a trench provided along the edge of the lighting area and separating the organic emissive layer in the lighting area and the organic emissive layer in the first and second contact areas and a metal film attached over the substrate in the lighting area and the second contact area. The metal film may be attached over the substrate with an adhesive.

Another exemplary aspect of the present disclosure provides a method of fabricating a lighting apparatus using an organic light-emitting diode, the method including: forming an organic emissive layer and a second electrode on the entire surface of the substrate where the passivation layer is formed, forming a trench by removing the organic emissive layer and the second electrode from the edge of the lighting area, the trench separating the organic emissive layer in the lighting area and the organic emissive layer in the first and second contact areas and attaching a metal film over the substrate in the lighting area and the second contact area, with an adhesive in between.

The first and second contact areas may be located outside the lighting area.

The lighting apparatus may further include a first contact electrode provided in the first contact area and configured as an extension of the first electrode to the first contact area.

The lighting apparatus may further include a contact hole exposing the first contact electrode, provided by removing the organic emissive layer and second electrode in the first contact area.

The lighting apparatus may further include a conductive film in the contact hole and over the second electrode in the first contact area, and electrically connected to the first contact electrode via the contact hole.

The lighting apparatus may further include a second contact electrode provided in the second contact area and made of the metal film.

The lighting apparatus may further include a protective film provided on the metal film in the lighting area.

The protective film may include an open hole exposing the second contact electrode.

The adhesive may contain conductive particles, and the metal film may be electrically connected to the second electrode by the conductive particles.

The conductive particles may be composed of nickel, carbon, or solder balls.

The organic emissive layer and the second electrode may be exposed through the sides of the substrate.

As described above, the lighting apparatus using an organic light-emitting diode and the method of fabricating the same according to an exemplary aspect of the present disclosure may simplify the fabrication process of the lighting apparatus without using an open mask (metal mask), which is a complicated tool. Accordingly, it is possible to reduce costs and simplify the processes and equipment, making them adaptable to a variety of models without additional cost.

Moreover, the lighting apparatus using an organic light-emitting diode and the method of fabricating the same according to an exemplary aspect of the present disclosure allow for patterning organic light-emitting diodes by using simple equipment, without using an open mask and other tools, making them useful for roll-to-roll manufacturing. This improves productivity while reducing manufacturing costs.

BRIEF DESCRIPTION OF THE DRAWINGS

The accompanying drawings, which are included to provide a further understanding of the disclosure and are incorporated in and constitute a part of this specification, illustrate exemplary aspects and together with the description serve to explain the principles of the disclosure.

In the drawings:

FIGS. 9A to 9F are cross-sectional views sequentially showing a method of fabricating the lighting apparatus using an organic light-emitting diode, shown in FIG. 3, according to an exemplary aspect of the present disclosure;

DETAILED DESCRIPTION OF THE DISCLOSURE

Figure 1:
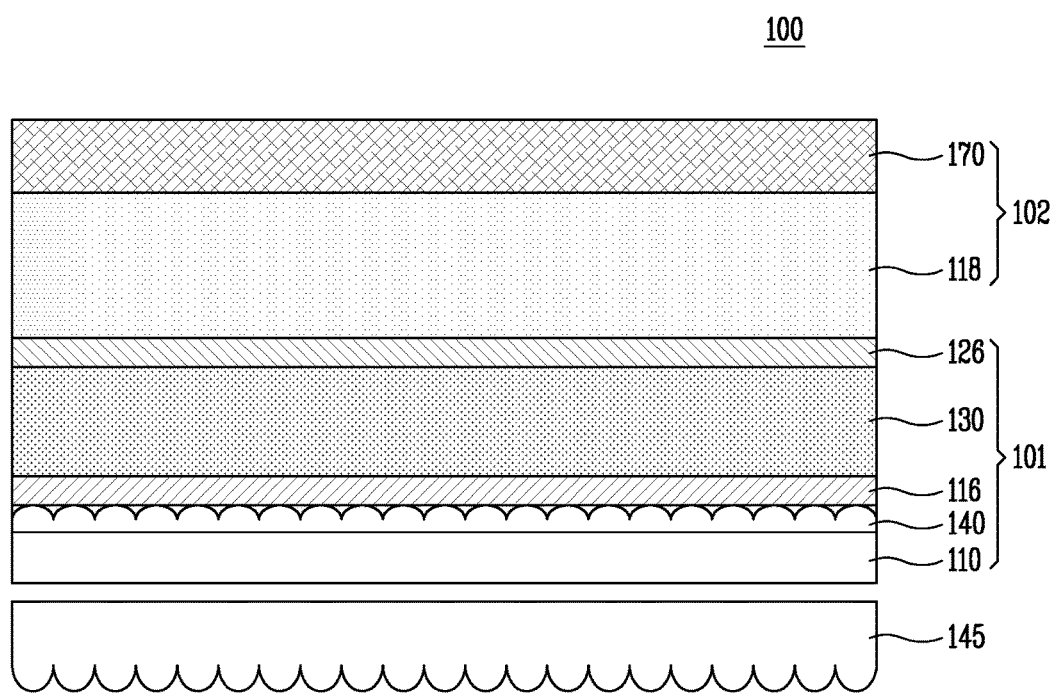
FIG. 1 is a cross-sectional view exemplifying a lighting apparatus using an organic light-emitting diode according to an exemplary aspect of the present disclosure.

Hereinafter, a lighting apparatus using an organic light-emitting diode and a method of fabricating the same according to a preferred aspect of the present disclosure will be described in sufficient detail to enable a person of ordinary skill in the art to readily practice the disclosure.

Advantages and features of the present disclosure and methods of accomplishing the same may be understood more readily by reference to the following detailed description of preferred aspects and the accompanying drawings. The present disclosure may, however, be embodied in many different forms and should not be construed as being limited to the aspects set forth herein. Rather, these aspects are provided so that this disclosure will be thorough and complete and will fully convey the concept of the disclosure to those skilled in the art, and the present disclosure will only be defined by the appended claims. Like numbers refer to like elements throughout the specification. In the drawings, the sizes and relative sizes of layers and regions may be exaggerated for clarity.

It will be understood that when an element or a layer is referred to as being "on" or "above" another element or layer, it can be directly on or above the other element or layer or intervening elements or layers may be present. In contrast, when an element or a layer is referred to as being "directly on" or "directly above" another element or layer, there are no intervening elements or layers present.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if an element illustrated in the drawings is turned over, the element described to be "below" or "beneath" another element may be put "above" the other element. Accordingly, the exemplary wording "below" may include both directions corresponding to "below" and "above".

The terms used in the present specification are used to describe example aspects of inventive concepts, and not to limit the inventive concepts. A singular form may include a plural form, unless otherwise defined. The terms "comprise" and/or "comprising" specify the existence of mentioned components, steps, operations and/or elements thereof, and do not exclude the existence or addition of one or more components, steps, operations and/or elements thereof.

FIG. 1 is a cross-sectional view exemplifying a lighting apparatus using an organic light-emitting diode according to an exemplary aspect of the present disclosure.

Figure 2:
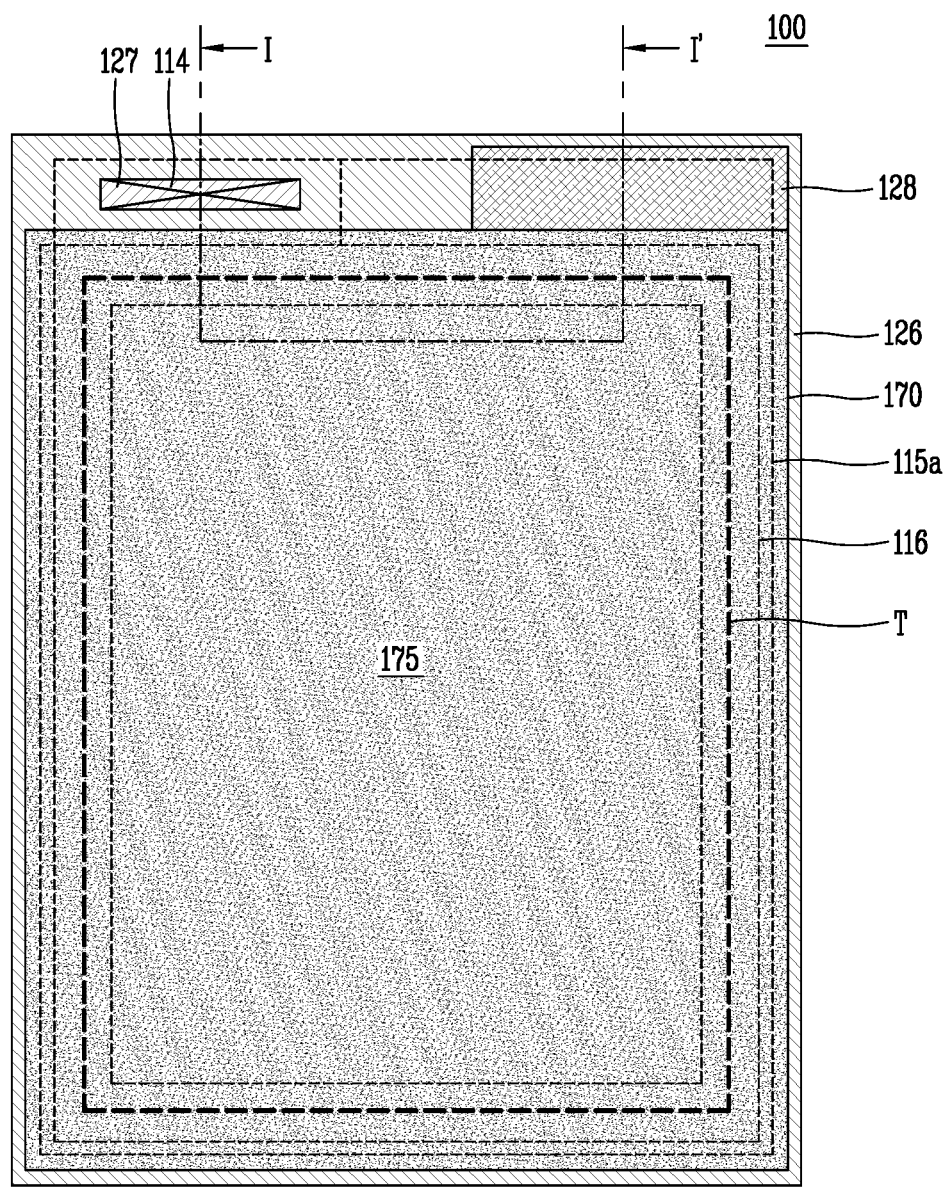
FIG. 2 is a plan view schematically showing a lighting apparatus using an organic light-emitting diode according to an exemplary aspect of the present disclosure.

FIG. 2 is a plan view schematically showing a lighting apparatus using an organic light-emitting diode according to an exemplary aspect of the present disclosure.

Figure 3:
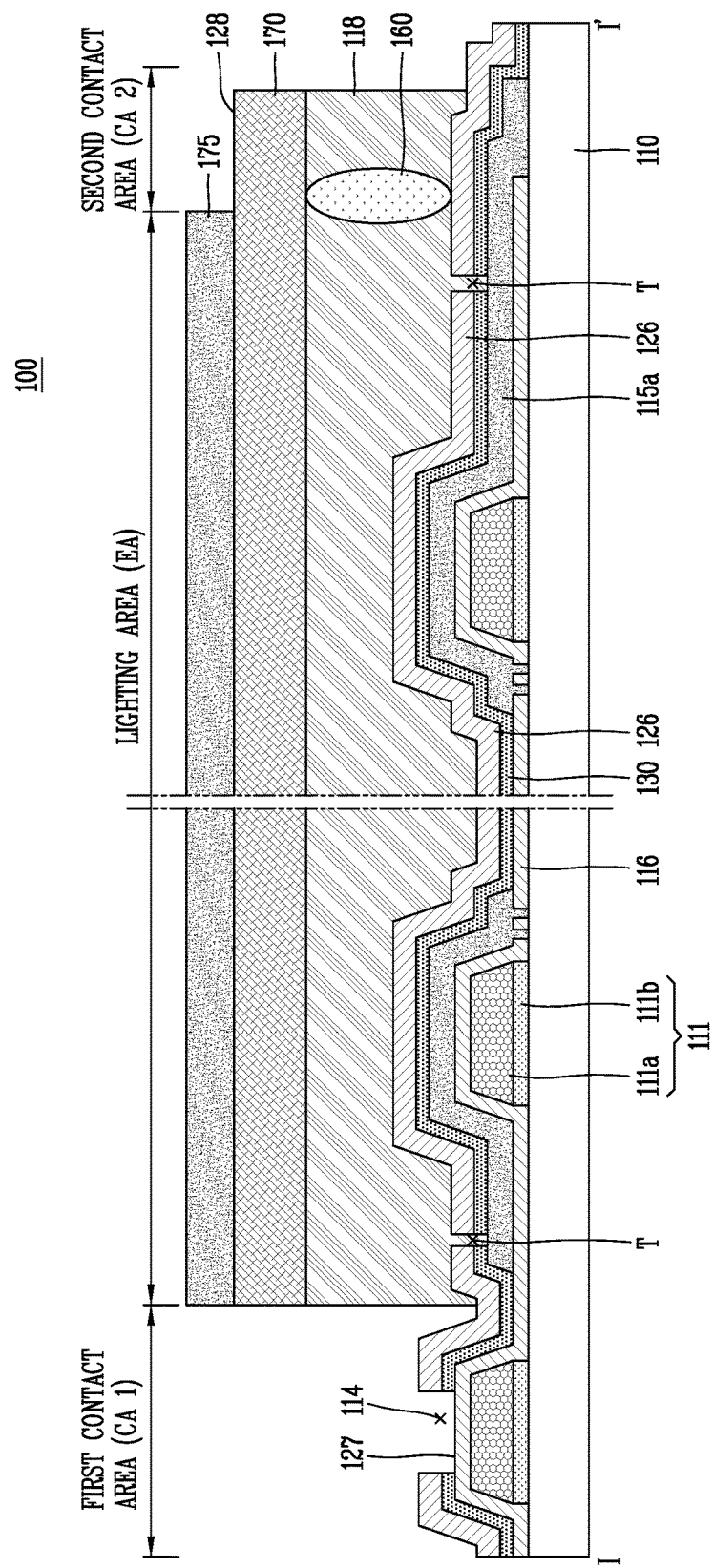
FIG. 3 is a schematic cross-sectional view of the lighting apparatus using an organic light-emitting diode according to an exemplary aspect of the present disclosure, taken along line I-I' of FIG. 2.

FIG. 3 is a schematic cross-section view of the lighting apparatus using an organic light-emitting diode according to an exemplary aspect of the present disclosure, taken along line I-I' of FIG. 2.

The present disclosure provides a lighting apparatus using an organic light-emitting diode made of organic material, rather than a lighting apparatus using an inorganic light-emitting diode made of inorganic material.

An OLED made of organic emissive material has relatively good green and red emission efficiency compared to an inorganic light-emitting diode. Another advantage of the OLED is that it offers an improved color rendering index because of its relatively broad red, green, and blue emission peak widths compared to the inorganic light-emitting diode, thereby generating light more close to sunlight.

In the description below, the lighting apparatus of the disclosure is described as a lighting apparatus that flexibly bends, but the present disclosure may be applicable not only to a bendable lighting apparatus, but also to general lighting apparatuses that are not bendable.

Referring to FIGS. 1 to 3, a lighting apparatus 100 using an organic light-emitting diode according to an exemplary aspect of the present disclosure may include an organic light-emitting diode part 101 where surface emission occurs, and a sealing part 102 that seals the organic light-emitting diode part 101.

In this case, an external light extraction layer 145 for increasing haze may be added to the bottom of the organic light-emitting diode part 101.

The external light extraction layer 145 is made of scattering particles of TiO2, etc. dispersed in resin, and may be attached to the bottom of a substrate 110 through an adhesive layer (not shown).

The organic light-emitting diode part 101 is made up of organic light-emitting diodes placed on the substrate 101. In this case, an internal light extraction layer 140 may be added between the substrate 110 and the organic light-emitting diodes.

A planarization layer (not shown) may be added to the top of the internal light extraction layer 140.

In this case, the substrate 110 may be divided into a lighting area EA that actually emits light and sends it out, and contact areas (pad areas) CA1 and CA2 that are electrically connected externally via contact electrodes (pad electrodes) 127 and 128 and apply signals to the lighting area EA.

The contact areas CA1 and CA2 may be electrically connected externally via the contact electrodes 127 and 128 as they are not covered by a metal film 170, used as a sealing means, and/or a protective film 175. The first contact electrode 127 is electrically connected externally as it is exposed via a contact hole 114, and the second contact electrode 128, formed from a portion of the metal film 170, may be electrically connected externally as it is not covered by the protective film 175. In this case, the first contact electrode 127 may be electrically connected externally through a conductive film such as ACF. However, the present disclosure is not limited to this, and an external electrical connection may be made through a given conductive layer that may be formed in the contact hole 114.

The contact areas CA1 and CA2 may be located outside the lighting area EA. For example, referring to FIG. 2, the contact areas CA1 and CA2 are located outside the upper part of the lighting area EA—that is, the first contact area CA1 may be located on the left side, and the second contact area CA2 may be located on the right side. This makes the module process easy. However, the present disclosure is not limited to this configuration. The metal film 170 may be attached to the entire surface of the lighting area EA and second contact area CA2 of the substrate 110, but not to the first contact area CA1, and the protective film 175 may be attached to the entire surface of the lighting area EA of the substrate 110, but not to the contact areas CA1 and CA2.

An organic light-emitting diode is formed by a first electrode 116 and a second electrode 126 positioned on the substrate 110 and an organic emissive layer 130 situated between the first and second electrodes 116 and 126. In the lighting apparatus 100 of such a structure, when a signal is applied to the first electrode 116 and second electrode 126 of the organic light-emitting diode, the organic emissive layer 130 produces and emits light through the lighting area EA.

The organic emissive layer 130 may be made up of light-emitting layers that produce white light. For example, the organic emissive layer 130 may be made up of blue, red, and green emitting layers or may be made up of a blue emitting layer and a yellow-green emitting layer stacked in tandem. However, the organic emissive layer 130 of this disclosure is not limited to the above-described structure, but various structures may be applied to it.

The organic emissive layer 130 of this disclosure may further include an electron injection layer and a hole injection layer that respectively inject electrons and holes into the emitting layers, an electron transport layer and a hole transport layer that respectively transport the injected electrons and holes to the emitting layers, and a charge generating layer that generates electric charges such as electrons and holes.

In this case, a trench T exposing a passivation layer 115a may be formed by removing the organic emissive layer 130 and the second electrode 126 from the edge of the lighting area EA. The trench T is formed in the shape of a closed curve along the edge of the lighting area EA, and functions to prevent moisture from penetrating the organic emissive layer 130 in the lighting area EA. Generally, polymers used as organic emissive materials, when combined with moisture, degrade quickly in their light-emitting characteristics, and the luminous efficiency of the organic emissive layer 130 therefore decreases. Especially when the organic emissive layer 130 in the lighting apparatus 100 is partially exposed to the outside, moisture spreads into the lighting apparatus 100 along the organic emissive layer 130, thereby lowering the luminous efficiency of the lighting apparatus 100. To overcome this, in the present disclosure, the trench T is formed along the edge of the lighting area EA, so as to prevent moisture from penetrating the organic emissive layer 130 in the lighting area EA of the lighting apparatus 100 from which light is actually produced and emitted.

Referring to FIG. 2, the trench T of this disclosure may be formed in the shape of an overall rectangular frame, but the present disclosure is not limited to this shape.

The trench T may separate (break or cut) the organic emissive layer 130 along the edge of the lighting area EA, thereby preventing moisture from spreading into the lighting area EA along the organic emissive layer 130. In particular, the trench T of this disclosure may simplify the process by laser ablation without using any photolithography process.

In this case, the first electrode 116 including the first contact electrode 127 is positioned on the substrate 110 made of a transparent material. The substrate 110, although may be made of a hard material such as glass, may be made of a flexible material such as plastic to make the lighting apparatus 100 bendable. Moreover, the present disclosure allows for roll-to-roll processing by using a flexible plastic material as the substrate 110, thus facilitating a fabrication process of the lighting apparatus 100.

The first electrode 116 including the first contact electrode 127 is formed in the lighting area EA and the first contact area CA1, and may be made of a transparent conductive material with a high work function. For example, in the present disclosure, the first electrode 116 including the first contact electrode 127 may be made of a conductive material of tin oxide, such as ITO (indium tin oxide) or a conductive material of zinc oxide, such as IZO (indium zinc oxide), or may also be made of a transparent conductive polymer.

The first electrode 116 may extend to the first contact area CA1 outside the lighting area EA and functions as the first contact electrode 127.

An auxiliary electrode 111 may be placed in the lighting area EA and the first contact area CA1 of the substrate 110 and electrically contacts the first electrode 116. The first electrode 116 has the advantage of being made of a transparent conductive material and transmitting emitted light therethrough, but also has the disadvantage that it has very high electrical resistance compared to opaque metals. Accordingly, in the fabrication of a large-area lighting apparatus 100, an electrical current applied to a wide lighting area may not be uniformly distributed due to the high resistance of the transparent conductive material, and this non-uniform current distribution makes it impossible for the large-area lighting apparatus 100 to emit light with uniform brightness.

The auxiliary electrode 111 is positioned across the entire lighting area EA, in the shape of a matrix form of thin lines, a mesh, a hexagon, an octagon, or a circle so that an electric current is evenly applied to the first electrode 116 over the entire lighting area EA, thus enabling the large-area lighting apparatus 100 to emit light with uniform brightness.

Although FIG. 3 illustrates an example where the auxiliary electrode 111 is positioned below the first electrode 116 including the first contact electrode 127, the present disclosure is not limited to this example, and the auxiliary electrode 111 may be positioned over the first electrode 116 including the first contact electrode 127. The auxiliary electrode 111 placed in the first contact area CA1 may be used as a current transfer path to the first electrode 116, and also may function as a contact electrode that comes into contact with the outside and applies an external current to the first electrode 116.

The auxiliary electrode 111 may be made of a metal with high conductivity, such as Al, Au, Cu, Ti, W, Mo, or an alloy thereof. The auxiliary electrode 111 may have a two-layer structure of an upper auxiliary electrode 111a and a lower auxiliary electrode 111b, but the present disclosure is not limited to this structure, and the auxiliary electrode 111 may consist of a single layer.

The passivation layer 115a may be stacked in the lighting area EA and the second contact area CA2 of the substrate 110. Although FIG. 2 illustrates that the passivation layer 115a is in the shape of a rectangular frame having a certain width, the present disclosure is not limited to this shape.

The passivation layer 115a in the lighting area EA may be formed to cover the auxiliary electrode 111 and the overlying first electrode 116, but the passivation layer 115a is not formed at a portion of the light-emission area where light is actually emitted. In particular, the passivation layer 115a in the lighting area EA reduces the difference in level (or step coverage) caused by the auxiliary electrode 111 as it surrounds the auxiliary electrode 111, which allows for stable formation of various layers to be formed later, without separation.

The passivation layer 115a may be made of an inorganic material such as $SiO_x$ or $SiN_x$. Alternatively, the passivation layer 115a may be made of an organic material such as photoacryl or be made of a plurality of layers of inorganic and organic materials.

The lighting apparatus 100 using an organic light-emitting diode according to an exemplary aspect of the present disclosure is characterized in that the organic emissive layer 130 and the second electrode 126 are positioned on the entire surface of the substrate 110 where the first electrode 116 and the passivation layer 115a are placed.

That is, the lighting apparatus 100 using an organic light-emitting diode according to an exemplary aspect of the present disclosure is characterized in that the organic emissive layer 130 and the second electrode 126 are deposited on the entire surface, without using an open mask, which is a separate, complicated tool, and then the organic emissive layer 130 in the lighting area EA and the contact areas CA1 and CA2 becomes separated (broken or cut) by laser ablation, and at the same time, the contact hole 114 for a contact with the anode is formed.

In this case, the trench T is formed by removing the organic emissive layer 130 and the second electrode 126 from the edge of the lighting area EA of the substrate 110 by laser ablation. Hereupon, the surface of the first passivation layer 115a may be exposed via the trench T.

Moreover, the contact hole 114 exposing the first contact electrode 127 may be formed in the first contact area CA1 of the substrate 110 by removing a certain part of the organic emissive layer 130 and the second electrode 126 by laser ablation.

As such, the first contact electrode 127 may be formed from the first electrode 116 or as an additional electrode (not shown), and the second contact electrode 128 may be formed from the metal film 170.

When using an open mask as in the conventional art, different open masks should be used on the organic emissive layer 130 and the second electrode 126, respectively. This requires elaborate processes in manufacturing masks and tools. Moreover, in roll-to-roll processing, continuous feeding is required on the roll-to-sheet in one-pass rather than in individual sheets. Thus, complicated line equipment is required, and it is difficult to achieve precision.

Accordingly, the present disclosure, without using open masks, may reduce costs and simplify processes and equipment, making them adaptable to a variety of models without additional cost. Moreover, OLEDs may be patterned using simple equipment, without using an open mask and other tools, which is useful for roll-to-roll manufacturing.

That is, the present disclosure allows for micro-pattern forming, without using complicated masks and tools, in roll-to-roll processing as well as in glass processing. Conventionally, open masks of different shapes have been manufactured and used for different types of products. On the other hand, when a laser process is used, all that has to be done is to change design information and input the changed information to the equipment, without any alteration of open masks. This allows for easy adaptation to various types of products.

As described above, the organic emissive layer 130 is a white organic emissive layer, and may be made up of blue, red, and green emitting layers or be made up of a blue emitting layer and a yellow-green emitting layer stacked in tandem. Moreover, the organic emissive layer 130 may include an electron injection layer and a hole injection layer that respectively inject electrons and holes into the emitting layers, an electron transport layer and a hole transport layer that respectively transport the injected electrons and holes to the emitting layers, and a charge generating layer that generates electric charges such as electrons and holes.

The second electrode 126 may be made of metal, such as Al, Mo, Cu, and Ag, or an alloy such as MoTi.

The first electrode 116, the organic emissive layer 130, and the second electrode 126 in the lighting area EA constitute an organic light-emitting diode. The first electrode 116 is the anode of the organic light-emitting diode, and the second electrode 126 is the cathode. When an electrical current is applied to the first electrode 116 and the second electrode 126, electrons are injected into the organic emissive layer 130 from the second electrode 126, and holes are injected into the organic emissive layer 130 from the first electrode 116. Thereafter, an exciton is created in the organic emissive layer 130, and the decay of the exciton results in generating light that is equivalent to the difference in energy between the lowest unoccupied molecular orbital and highest occupied molecular orbital (HOMO and LUMO) of the emissive layer, causing the light to radiate downward (towards the substrate 110 in the figure).

Since the passivation layer 115a is positioned over the auxiliary electrode 111 in the lighting area EA, the organic emissive layer 130 above the auxiliary electrode 111 does not come into direct contact with the first electrode 116 and therefore the organic light-emitting diode is not present on the auxiliary electrode 111. That is, the organic light-emitting diode in the lighting area EA is formed only at a portion the light-emission area between the auxiliary electrodes 111 that have the shape of a matrix, for example.

As the above-described trench T is formed on the edge of the lighting area EA of the substrate 110, the organic emissive layer 130 in the lighting area EA and the organic emissive layer 130 in the contact areas CA1 and CA2 may be separated from each other. In the present disclosure, since the organic emissive layer 130 in the lighting area EA and the organic emissive layer 130 in the contact areas CA1 and CA2 are separated by the trench T, moisture penetrating the outer region of the organic emissive layer 130 may be prevented from spreading along the organic emissive layer 130 into a portion of the lighting area EA from which light is actually emitted. Moreover, in the present disclosure, the organic emissive layer 130 becomes separated by laser ablation without an additional open mask or a photolithography process, thereby avoiding an additional fabrication process and the resulting increase in cost.

Likewise, the second electrode 126 in the lighting area EA and the second electrode 126 in the contact areas CA1 and CA2 are separated from each other by the above-described trench T because the second electrode 126 is positioned over the organic emissive layer 130 in the lighting area EA and contact areas CA1 and CA2.

An adhesive 118 such as PSA (pressure sensitive adhesive) is applied to the lighting area EA and the second contact area CA2 of the substrate 110 where the second electrode 126 is formed, and the metal film 170 is positioned over the adhesive 118 so that the metal film 170 is attached to the substrate 110 to seal the lighting apparatus 100.

Then, a given protective film 175 may be attached to the entire surface of the lighting area EA of the substrate 110, but not to the contact areas CA1 and CA2.

The adhesive 118 may be a light curing adhesive or a heat curing adhesive.

The adhesive 118 according to an exemplary aspect of the present disclosure contains conductive particles 160, and the metal film 170 including the second contact electrode 128 is electrically connected to the second electrode 126 by the conductive particles 160.

The conductive particles 160 may be nickel, carbon, solder balls, etc.

In this case, as described above, the contact hole 114 is formed in the first contact area CA1 of the substrate 110 by removing a portion of the organic emissive layer 130 and the second electrode 126, and the first contact electrode 127 connected to the first electrode 116 may be exposed externally via the contact hole 114. The second contact electrode 128 is formed from a portion of the metal film 170, and the second contact electrode 128 may be electrically connected to the second electrode 126 by conductive particles 160 in the adhesive 118. Thus, the first contact electrode 127 and the second contact electrode 128 are electrically connected to an external power source to apply an electrical current to the first electrode 116 and the second electrode 126, respectively.

Moreover, as described above, in the present disclosure, the organic emissive layer 130 and the second electrode 126 are stacked on the entire surface of the substrate 110, and the trench T is formed by laser ablation to separate the organic emissive layer 130, thereby preventing moisture from penetrating and spreading into the organic emissive layer 130 in the lighting area EA.

Moreover, the present disclosure allows for roll-to-roll manufacturing since the substrate 110 is made of a flexible plastic film and the organic emissive layer 130 and the second electrode 126 are deposited on the entire surface. This enables rapid processes in manufacturing the lighting apparatus 100 and reducing the manufacturing costs.

Figure 4:
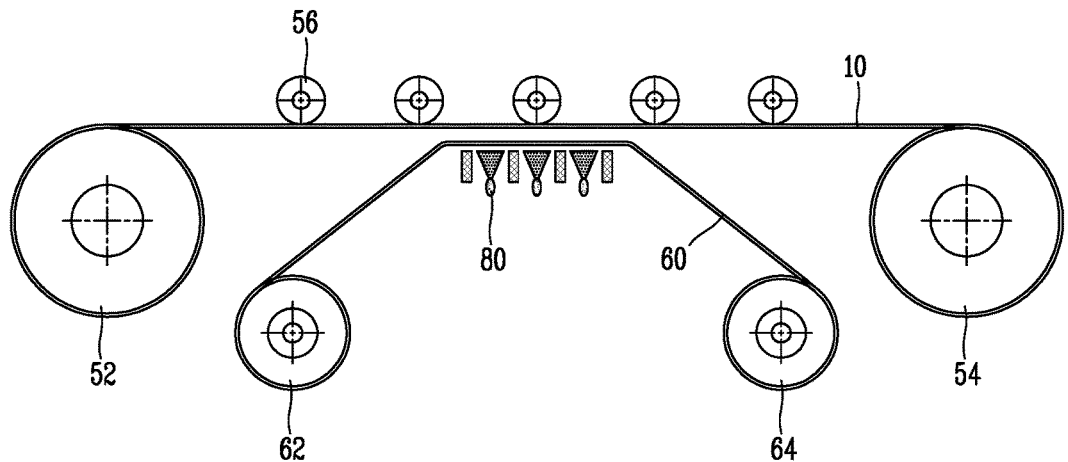
FIG. 4 is a cross-sectional view exemplifying the concept of roll-to-roll equipment.

FIG. 4 is a cross-sectional view exemplifying the concept of roll-to-roll equipment for manufacturing a flexible lighting apparatus that can be bent.

Referring to FIG. 4, the roll-to-roll equipment for manufacturing a flexible lighting apparatus includes a film feed roller 52 feeding a plastic film 10, a film recovery roller 54 recovering the plastic film 10, and a guide roller 56 guiding the plastic film 10.

Moreover, the roll-to-roll equipment includes a mask feed roller 62 feeding an open mask 60 (or metal mask), a mask recovery roller 64 recovering the open mask 60, and an evaporator 80 depositing an organic material or metal.

In the roll-to-roll equipment thus constructed, the plastic film 10 used as a substrate for the lighting apparatus is fed from the film feed roller 52 to the evaporator 80, and at the same time, the open mask 60 is fed from the mask feed roller 62 to the evaporator 80. With the open mask 60 positioned on the entire surface of the plastic film 10, the evaporator 80 is used to deposit an organic material or metal in some part of the plastic film 10.

After the deposition, the open mask 60 is separated from the plastic film 10, and the plastic film 10 is recovered by the film recovery roller 64 and the open mask 60 is recovered by the mask recovery roller 64.

Using the roll-to-roll equipment with this structure, the plastic film 10 is continuously fed by the film feed roller 62, thereby enabling rapid fabrication of the lighting apparatus in the continuous process. However, this roll-to-roll equipment has the following problems.

The roll-to-roll equipment may be used in forming a variety of metal patterns—especially useful when forming the organic emissive layer, the second electrode, etc. This can be achieved easily by roll-to-roll manufacturing because the organic emissive layer or the second electrode is deposited across the entire area of the substrate, rather than being patterned by a photolithography process in a certain part of the substrate.

However, when an organic emissive layer is formed by depositing an organic emissive material on the entire surface of the substrate by the roll-to-roll equipment, the side of the organic emissive layer deposited over the entire surface is formed at the same level as the side of the substrate, thus causing the organic emissive layer to be exposed to the outside from the side of the lighting apparatus. The organic emissive material is susceptible to moisture and, when combined with moisture, degrades quickly, causing the moisture to spread easily. Accordingly, the organic emissive layer should be kept from being exposed externally in the fabrication of the lighting apparatus, in order to prevent the lighting apparatus from becoming defective due to the spread of moisture through the externally exposed organic emissive layer.

Hence, as the open mask blocks the perimeter area of the substrate, the organic emissive layer is not deposited in the perimeter area of the substrate when depositing the organic emissive material. Moreover, by sealing the perimeter area with a sealant or an adhesive, the side of the organic emissive layer is sealed, and this prevents the organic emissive layer from being exposed to the outside.

However, when forming an organic emissive layer using the open mask 60, as shown in FIG. 4, a system (a feed roll, guide roll, recovery roll, etc.) that feeds the plastic film 10 and a system that feeds the open mask 60 should be integrated as an inline system. This increases not only the length of the process line but also the length of the open mask 60. Moreover, the plastic film 10 and the open mask 60 should be fed in sync, and also need to be aligned in a continuous process. In addition, the open mask 60 should be cleaned after use, which is difficult due to the long length of the open mask 60.

In other words, although a roll-to-roll manufacturing process requires the use of an open mask to enable rapid fabrication of a lighting apparatus, the open mask makes it practically difficult to fabricate the lighting apparatus by using the roll-to-roll equipment.

On the other hand, in the present disclosure, a trench is formed by removing the organic emissive layer from the edge of the lighting area of the substrate by laser ablation. As such, the organic emissive layer becomes separated by the trench, even when an organic emissive layer is deposited across the entire area of the substrate and the side of the organic emissive layer is therefore exposed to the outside, thereby preventing moisture from penetrating into the lighting area through the exposed organic emissive layer. Accordingly, a lighting apparatus according to the present disclosure can be fabricated without using an open mask, and this simplifies the fabrication process of the lighting apparatus, making it useful especially in roll-to-roll manufacturing.

In what follows, a lighting apparatus according to an exemplary aspect of the present disclosure and a method of fabricating a lighting apparatus with a typical structure by roll-to-roll processing will be described to explain the benefits of the fabrication process of a lighting apparatus according to an exemplary aspect of the present disclosure.

Figure 5:
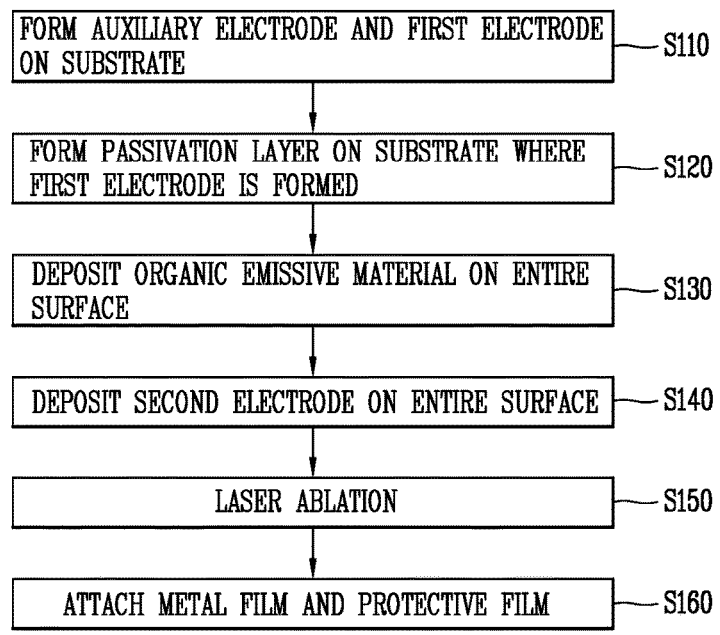
FIG. 5 is a flowchart sequentially showing a method of fabricating a lighting apparatus using an organic light-emitting diode according to an exemplary aspect of the present disclosure.

FIG. 5 is a flowchart sequentially showing a method of fabricating a lighting apparatus using an organic light-emitting diode according to an exemplary aspect of the present disclosure.

Referring to FIG. 5, firstly, an auxiliary electrode and a first electrode are formed on a substrate made of a flexible, transparent plastic film (S110), and then a passivation layer is formed by stacking and etching an inorganic material (S120). The auxiliary electrode, first electrode, and passivation layer may be formed by inside roll-to-roll equipment with a photolithographic process using a photoresist and a photomask.

Subsequently, an organic emissive layer is formed by depositing an organic emissive material on the entire surface of the substrate by using the roll-to-roll equipment shown in FIG. 4 (S130). Since, in the present disclosure, an organic emissive material is deposited without using an open mask, the roll-to-roll equipment shown in FIG. 4 does not require the use of an open mask, mask feed roller, and mask recovery roller.

Afterwards, a second electrode is formed by depositing a metal on the entire surface of the substrate (S140).

Subsequently, using laser ablation, a trench is formed along the edge of the lighting area of the substrate by removing portions of the organic emissive layer and the second electrode by laser ablation, and at the same time a contact hole exposing a portion of 0a first contact electrode is formed in a first contact area (S150).

Afterwards, a metal film is attached for sealing using an adhesive containing conductive particles, and at the same time a second contact electrode of a metal film is electrically connected to the second electrode through the conductive particles (S160). Then, a protective film is attached to the entire surface of the lighting area of the substrate.

Figure 6:
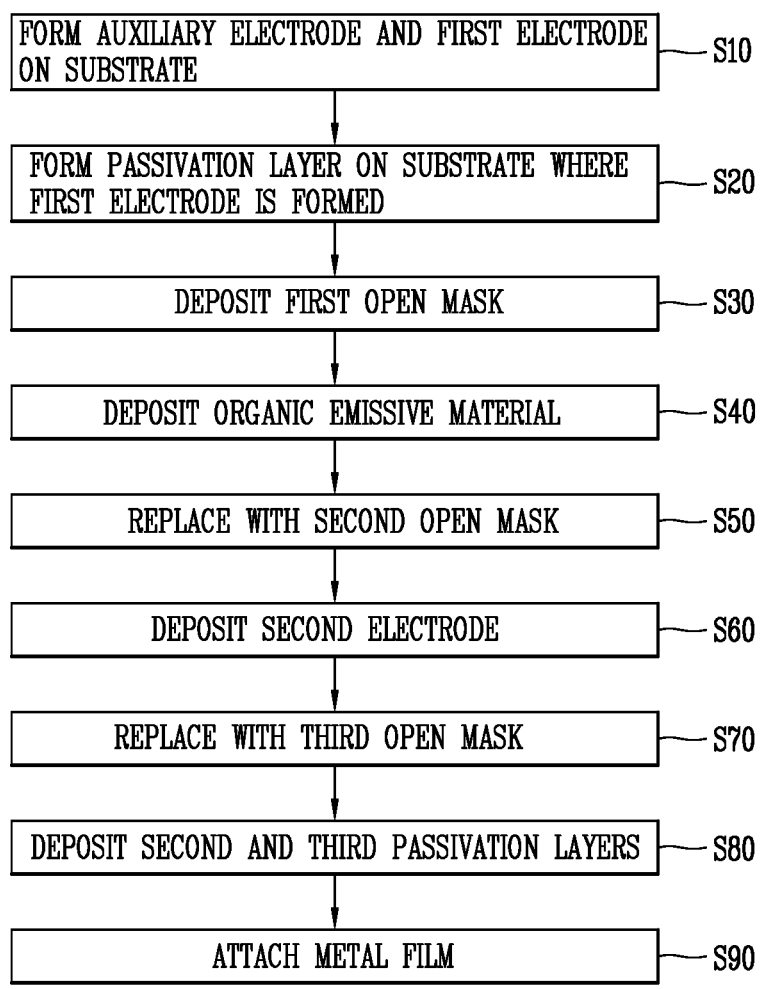
FIG. 6 is a flowchart sequentially showing a method of fabricating a lighting apparatus using an organic light-emitting diode according to a comparative example.

FIG. 6 is a flowchart sequentially showing a method of fabricating a lighting apparatus using an organic light-emitting diode according to a comparative example.

Referring to FIG. 6, firstly, an auxiliary electrode and a first electrode are formed on a substrate made of a flexible, transparent plastic film (S10), and then a first passivation layer is formed by stacking and etching an inorganic material (S20).

Subsequently, a first open mask (metal mask) is placed on the entire surface of the substrate, and then an organic emissive layer is formed by depositing an organic emissive material (S30 and S40).

Afterwards, the first open mask placed on the entire surface of the substrate is replaced with a new, second open mask, and then a metal is deposited to form a second electrode (S50 and S60).

Subsequently, the second open mask placed on the entire surface of the substrate is replaced with a new, third open mask, and then second and third passivation layers are formed (S70 and S80).

Afterwards, a metal film is attached with an adhesive, thereby completing a lighting apparatus (S90).

As described above, the present disclosure requires no open mask when fabricating a lighting apparatus by using roll-to-roll equipment. Thus, the step of placing an open mask and the step of replacing the open mask are not needed, unlike with the lighting apparatus according to the comparative example. Therefore, the lighting apparatus according to an exemplary aspect of the present disclosure allows for rapid fabrication.

Moreover, in the case of the lighting apparatus according to the comparative example, the open masks used in the previous process should be cleaned after completion of the process on the plastic film on the feed roller, before a plastic film is fed to the feed roller to resume the process. By contrast, the fabrication of a lighting apparatus according to an exemplary aspect of the present disclosure does not require cleaning of open masks. Accordingly, no cleaning equipment is required when fabricating a lighting apparatus according to an exemplary aspect of the present disclosure. This may reduce costs and prevent environmental contamination caused by cleaning. Moreover, no cleaning process is required between two consecutive deposition processes, thereby making the fabrication even more rapid.

Additionally, the lighting apparatus according to the comparative example requires equipment for positioning an open mask in front of the substrate, whereas the exemplary aspect of the present disclosure does not require such equipment, thereby simplifying the manufacturing equipment and reducing costs.

Figure 7A:
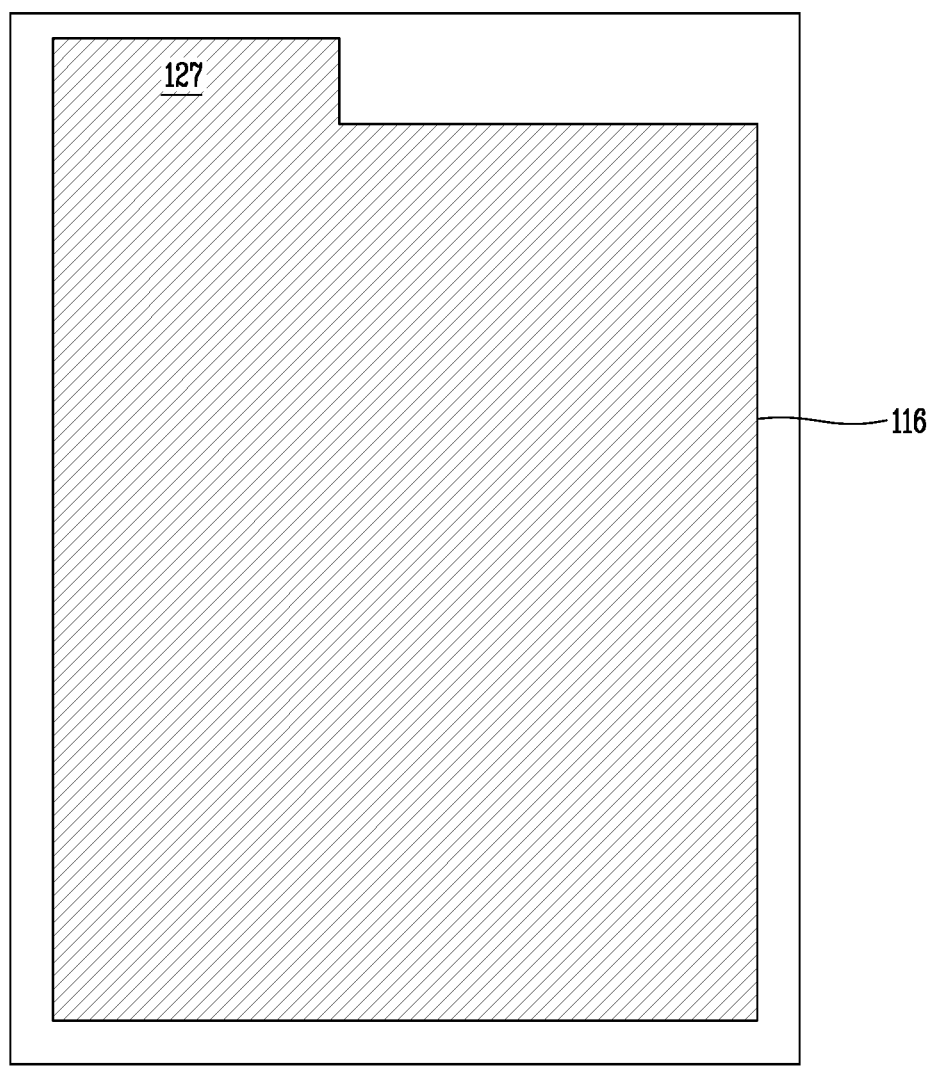
FIGS. 7A to 7G are plan views sequentially showing a method of fabricating the lighting apparatus using an organic light-emitting diode, shown in FIG. 2, according to an exemplary aspect of the present disclosure.
Figure 7B:
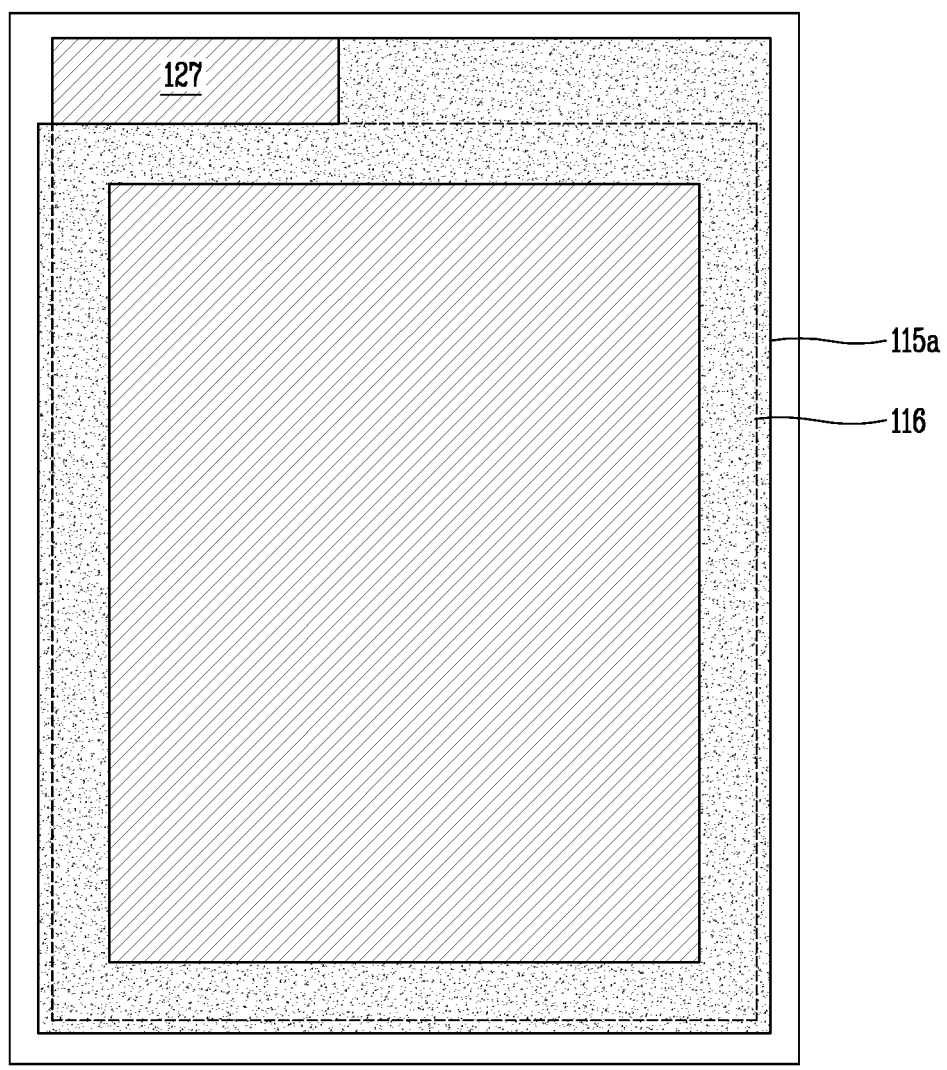
Figure 8:
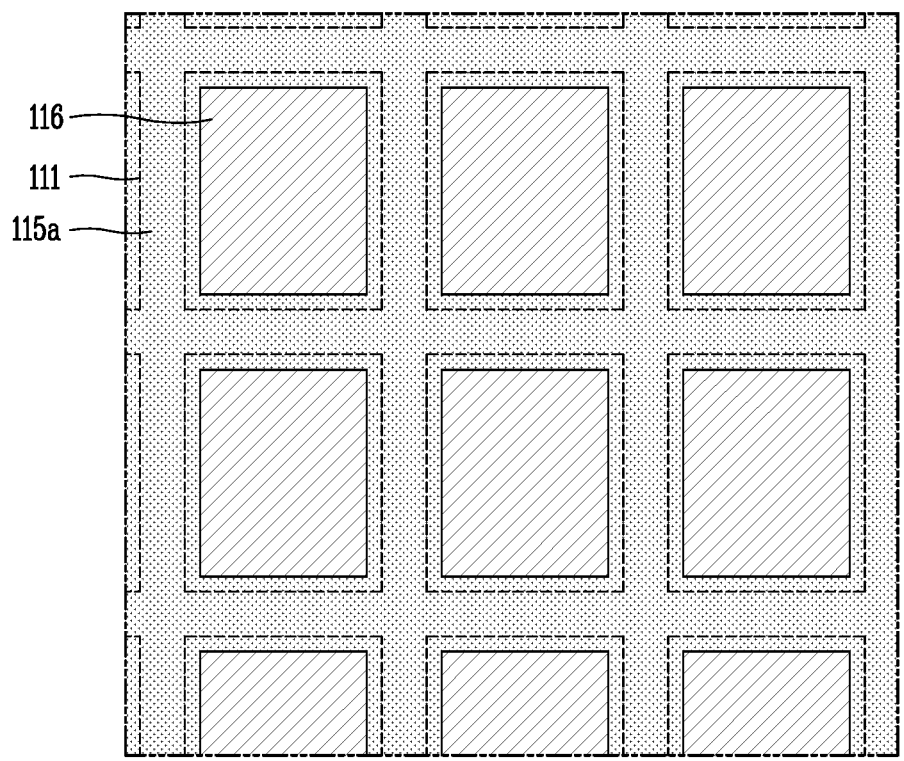
FIG. 8 is an enlarged view of a portion of the lighting area of FIG. 7B.

FIGS. 7A to 7G are plan views sequentially showing a method of fabricating the lighting apparatus using an organic light-emitting diode, shown in FIG. 2, according to an exemplary aspect of the present disclosure;

FIG. 8 is an enlarged view of a portion of the lighting area of FIG. 7B;

FIGS. 9A to 9F are cross-sectional views sequentially showing a method of fabricating the lighting apparatus using an organic light-emitting diode, shown in FIG. 3, according to an exemplary aspect of the present disclosure;

While the fabrication method here is illustrated with reference to a process carried out on roll-to-roll equipment, the present disclosure is not limited to the roll-to-roll equipment but may be applicable to general manufacturing equipment using a glass substrate.

Figure 9A:
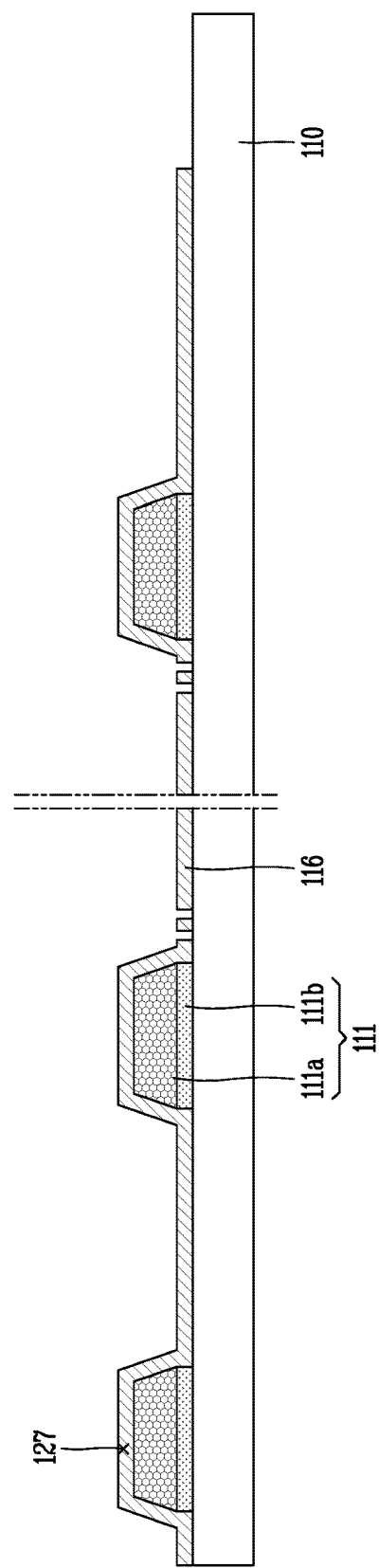

First of all, referring to FIGS. 7A and 9A, a metal such as Al, Au, Cu, Ti, W, and Mo, or an alloy thereof is deposited on a substrate 110 which is divided into a lighting area and contact areas, and then etched to form an auxiliary electrode 111 consisting of a single layer or a plurality of layers in the lighting area and the first contact area.

Although FIG. 9A illustrates an example where the auxiliary electrode 111 is formed of a two-layer structure of an upper auxiliary electrode 111a and a lower auxiliary electrode 111b, the present disclosure is not limited to this example, as stated above.

The auxiliary electrode 111 may be positioned across the entire lighting area EA, in the shape of a matrix form of thin lines (shown in FIG. 8), a mesh, a hexagon, an octagon, or a circle.

Afterwards, a transparent conductive material such as ITO or IZO is stacked on the entire substrate 110 and etched to form a first electrode 116 and a first contact electrode 127 in the lighting area and the first contact area. In this case, the first electrode 116 may extend to the first contact area outside the lighting area and constitute the first contact electrode 127.

While FIGS. 7A and 9A illustrate an example where the auxiliary electrode 111 is formed below the first electrode 116 including the first contact electrode 127, the present disclosure is not limited to this example, and the auxiliary electrode 111 may be formed over the first electrode 116 including the first contact electrode 127. The auxiliary electrode 111 placed in the first contact area may be used as a current transfer path to the first electrode 116, and also may function as a contact electrode that comes into contact with the outside and applies an external current to the first electrode 116.

Figure 9B:
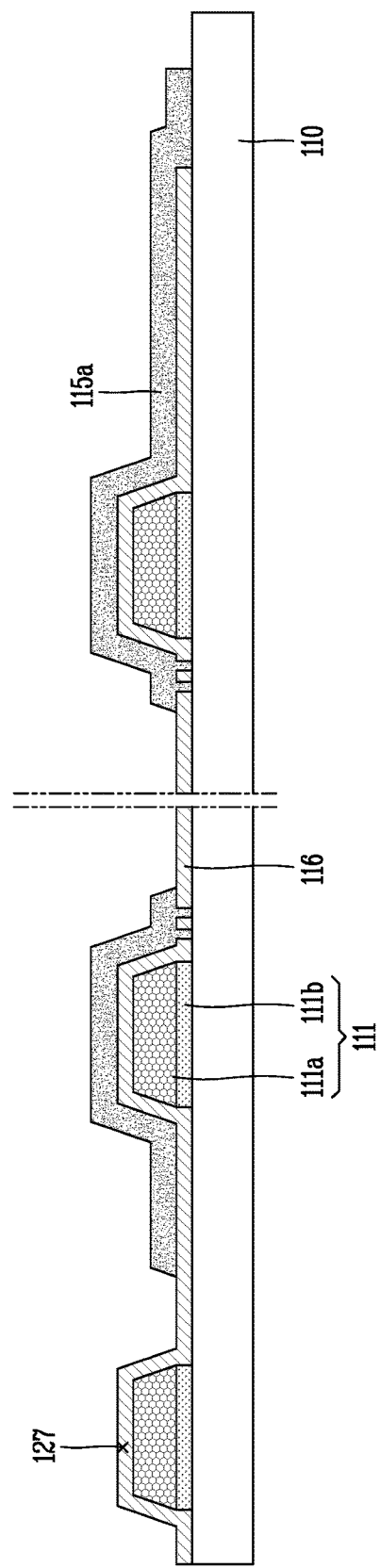

Subsequently, referring to FIGS. 7B and 9B, an inorganic material such as $SiN_x$ or $SiO_x$ or an organic material such as photoacryl is stacked in the lighting area and the second contact area of the substrate 110. Afterwards, the inorganic material or organic material is etched to form a passivation layer 115a on the top and side of the auxiliary electrode 111 in the lighting area and in a portion of the second contact area.

The passivation layer 115a in the lighting area may be formed to cover the auxiliary electrode 111 and the overlying first electrode 116, but the passivation layer 115a is not formed at a portion of the light-emission area where light is actually emitted (although in practice, referring to FIG. 8, the passivation layer 115a may be formed in a matrix shape in the light-emission area to cover the auxiliary electrode 111 arranged in a matrix shape). In particular, the passivation layer 115a in the lighting area reduces the difference in level (or step coverage) caused by the auxiliary electrode 111 as it surrounds the auxiliary electrode 111, which allows for stable formation of various layers that are to be formed later, without separation. Although FIG. 7B illustrates that the passivation layer 115a is in the shape of a rectangular frame of a certain width, the present disclosure is not limited to this shape.

Figure 7C:
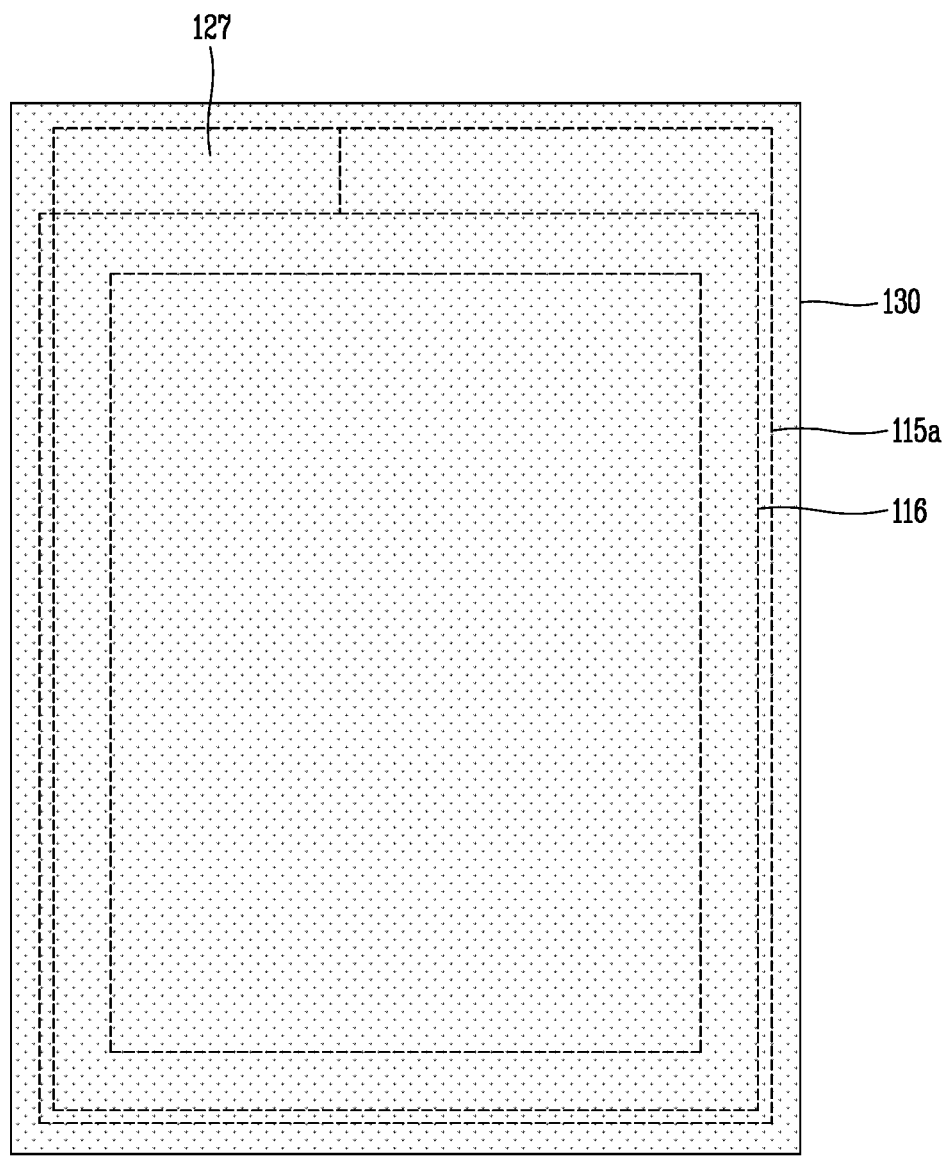
Figure 7D:
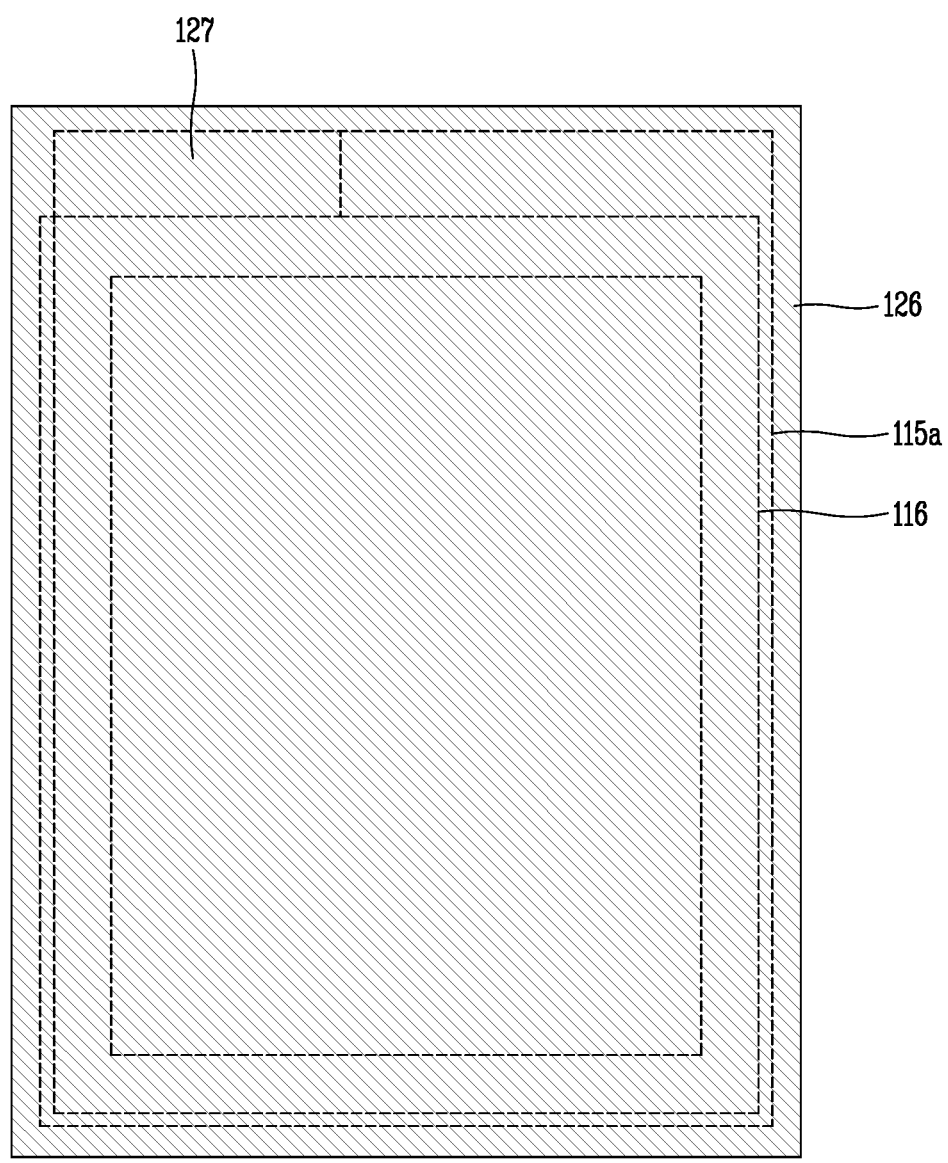
Figure 9C:
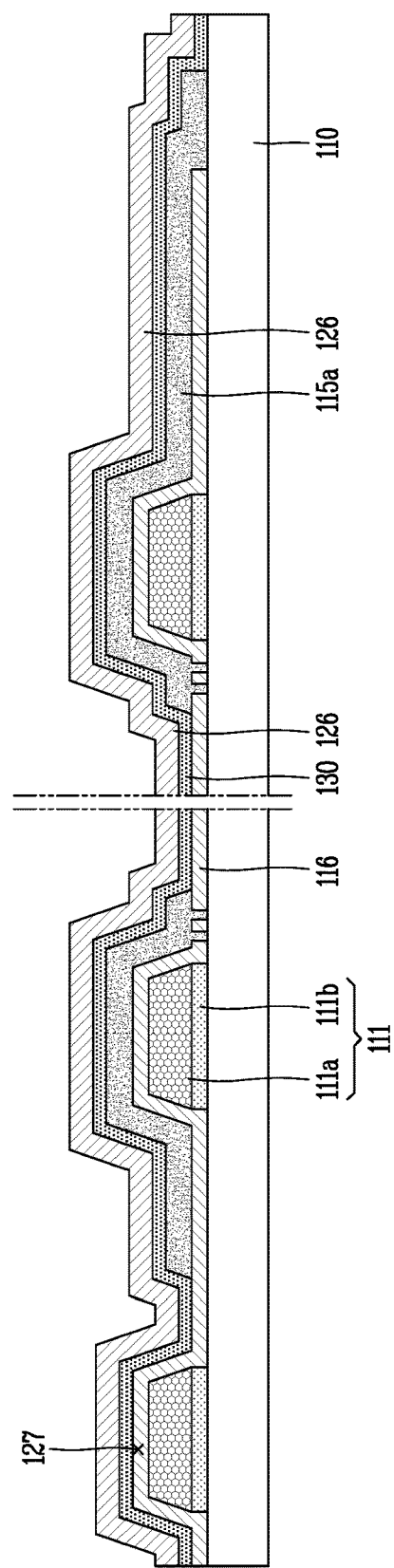

Subsequently, referring to FIGS. 7C, 7D, and 9C, an organic emissive layer 130 and a second electrode 126 are formed by sequentially depositing an organic emissive material and a metal across the entire surface of the substrate 110.

In this case, the organic emissive layer 130 is a white organic emissive layer, and may be made up of blue, red, and green emitting layers or be made up of a blue emitting layer and a yellow-green emitting layer stacked in tandem. Moreover, the organic emissive layer 130 may include an electron injection layer and a hole injection layer that respectively inject electrons and holes into the emitting layers, an electron transport layer and a hole transport layer that respectively transport the injected electrons and holes to the emitting layers, and a charge generating layer that generates electric charges such as electrons and holes.

The second electrode 126 may be made of metal, such as Al, Mo, Cu, and Ag, or an alloy such as MoTi.

The first electrode 116, organic emissive layer 130, and second electrode 126 in the lighting area constitute an organic light-emitting diode.

Since the passivation layer 115a is positioned over the auxiliary electrode 111 in the lighting area, the organic emissive layer 130 above the auxiliary electrode 111 does not come into direct contact with the first electrode 116 and therefore the organic light-emitting diode is not present on the auxiliary electrode 111. That is, the organic light-emitting diode in the lighting area is formed only in the light-emission area defined by the auxiliary electrode 111 that has the shape of a matrix, for example (see FIG. 8).

As such, in the lighting apparatus using an organic light-emitting diode according to the exemplary aspect of the present disclosure, the organic emissive layer 130 and the second electrode 126 are deposited on the entire surface, without using an open mask, which is a separate, complicated tool, and this may reduce costs and simplify the processes and equipment, making them adaptable to a variety of models without additional cost. Moreover, OLEDs may be patterned using simple equipment, without using an open mask and other tools, which is useful for roll-to-roll manufacturing.

Figure 7E:
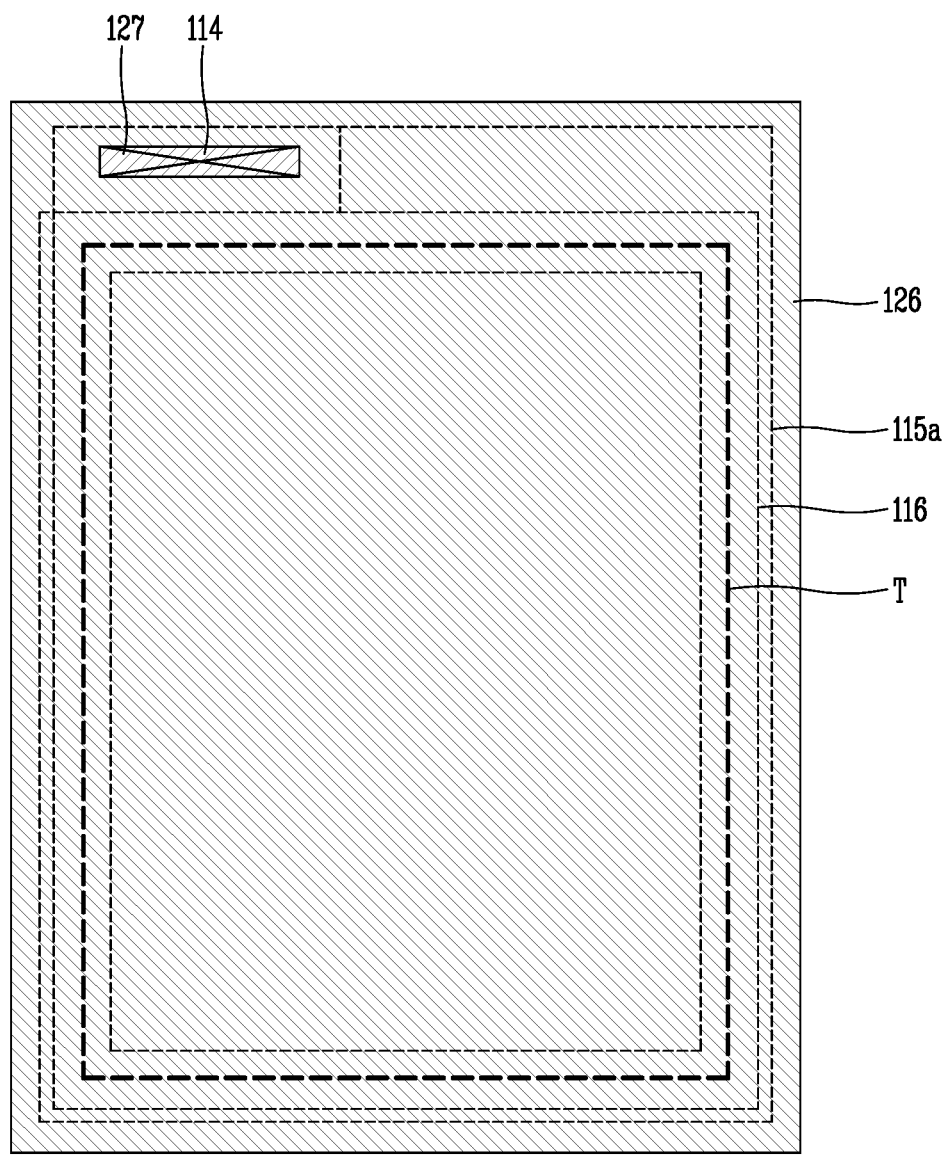
Figure 9D:
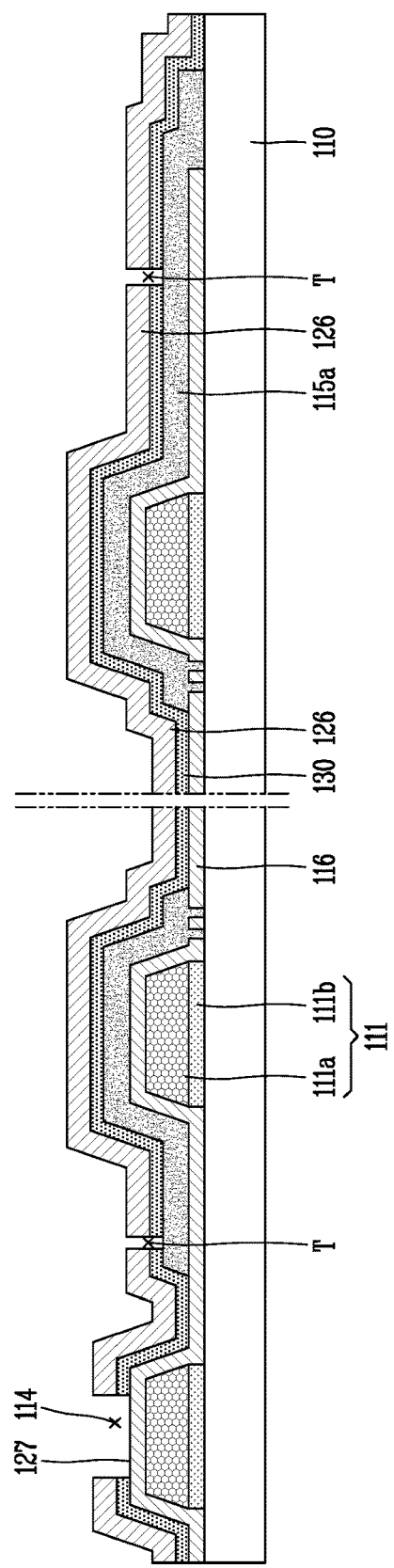

Subsequently, referring to FIGS. 7E and 9D, a trench T exposing the surface of the passivation layer 115a is formed along the edge of the lighting area of the substrate 110 by partially removing the organic emissive layer 130 and second electrode 126 which are deposited over the entire surface.

Additionally, using laser ablation, a contact hole 114 exposing the first contact electrode 127 may be formed by removing the organic emissive layer 130 and second electrode 126 in the first contact area of the substrate 110.

As the above-described trench T is formed on the edge of the lighting area of the substrate 110, the organic emissive layer 130 in the lighting area and the organic emissive layer 130 in the contact areas may be separated from each other. In the present disclosure, since the organic emissive layer 130 in the lighting area and the organic emissive layer 130 in the contact areas are separated by the trench T, moisture penetrating the outer region of the organic emissive layer 130 may be prevented from spreading along the organic emissive layer 130 into the lighting area from which light is actually emitted. Moreover, in the present disclosure, the organic emissive layer 130 becomes separated by laser ablation without addition of any open mask or photolithography process, thereby avoiding an additional fabrication process and the resulting increase in cost.

Figure 7F:
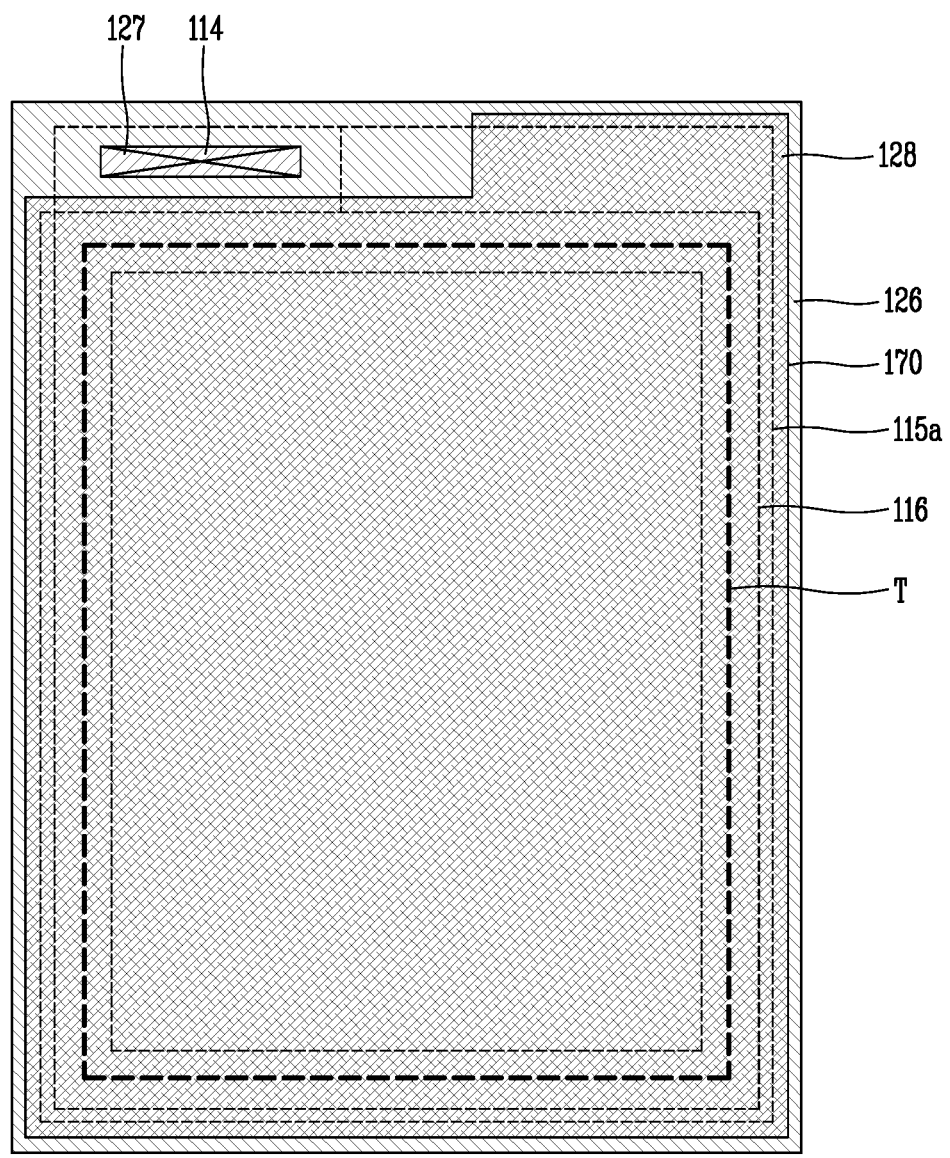

Subsequently, referring to FIGS. 7F and 9E, an adhesive 118 made of a light curing adhesive material or a heat curing adhesive material is applied over the substrate 110. Further, the metal film 170 is positioned over the adhesive 118, and then the adhesive 118 is cured to attach the metal film 117.

The adhesive 118 and the metal film 170 used as a sealing means may be attached to the lighting area and second contact area of the substrate 110 where the second electrode 126 is formed.

The adhesive 118 according to an exemplary aspect of the present disclosure contains conductive particles 160, and the metal film 170 including the second contact electrode 128 is electrically connected to the second electrode 126 by the conductive particles 160.

Figure 7G:
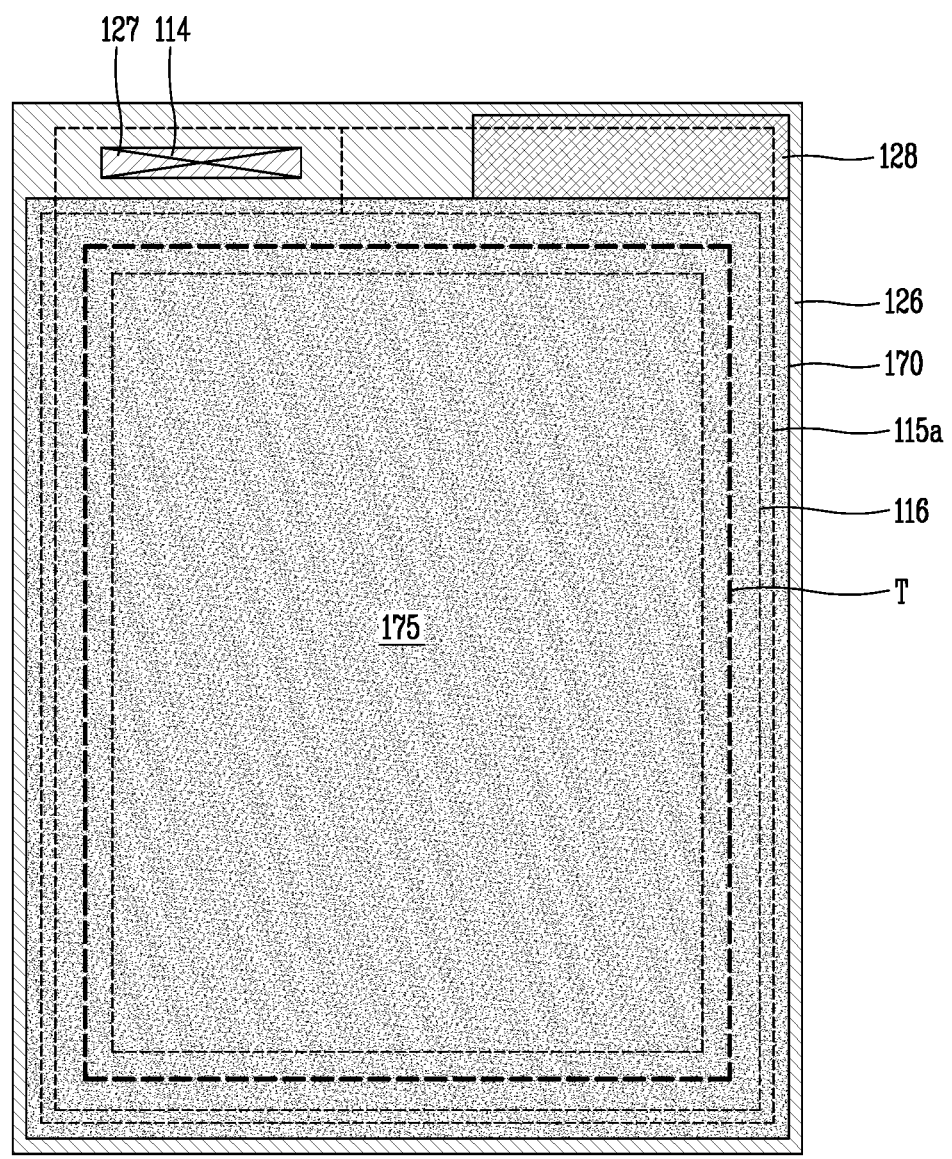
Figure 9F:
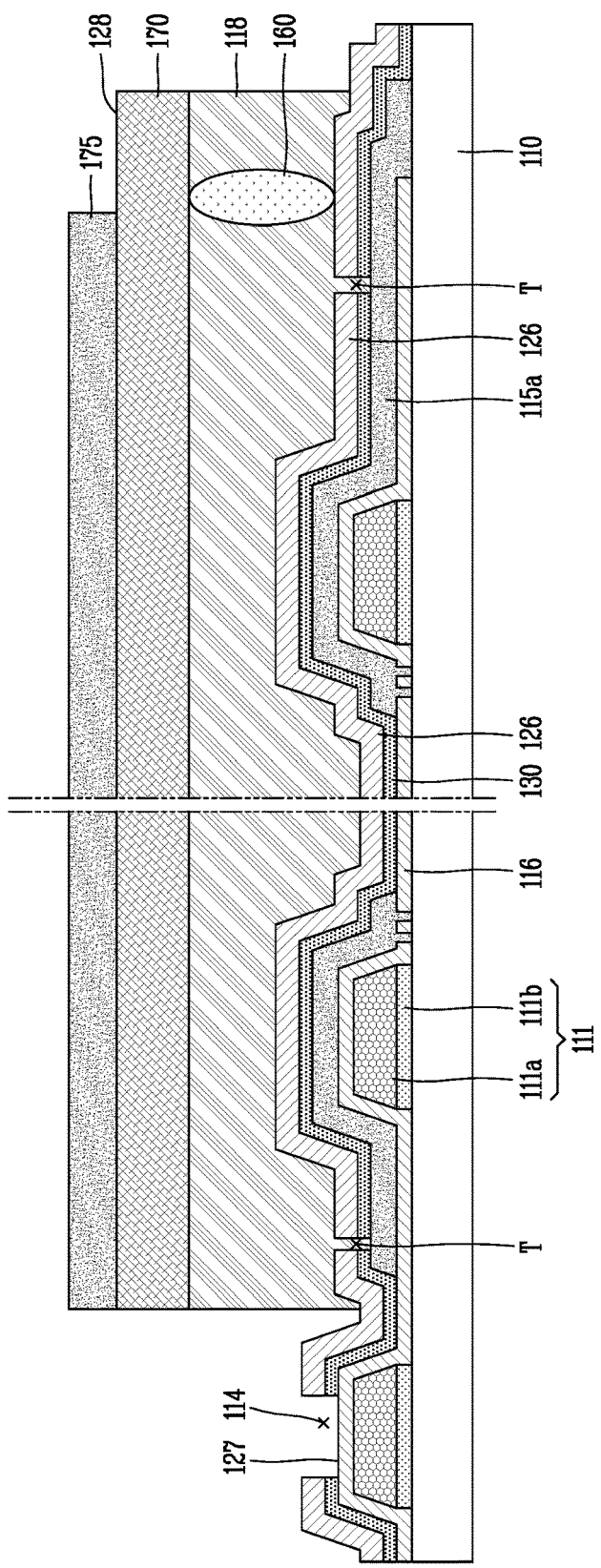

Afterwards, referring to FIGS. 7G and 9F, a given protective film 175 may be attached to the entire surface of the lighting area of the substrate 110, but not to the contact areas, thereby completing the lighting apparatus.

As described above, in the first contact area of the substrate 110, the first contact electrode 127 connected to the first electrode 116 may be exposed externally via the contact hole 114. The second contact electrode 128 is formed from a portion of the metal film 170, and at the same time, may be electrically connected to the second electrode 126 by the conductive particles 160 in the adhesive 118. Thus, the first contact electrode 127 and the second contact electrode 128 are electrically connected to an external power source to apply an electrical current to the first electrode 116 and the second electrode 126, respectively.

In this case, although the protective film 175 according to an exemplary aspect of the present disclosure is attached to the entire surface of the lighting area of the substrate 110, but not to the contact area, the present disclosure is not limited to this. In the present disclosure, instead of forming the protective film in the second contact area, an open hole may be formed to expose part of the second contact electrode, which will be described in detail with respect to another exemplary aspect of the present disclosure.

Figure 10:
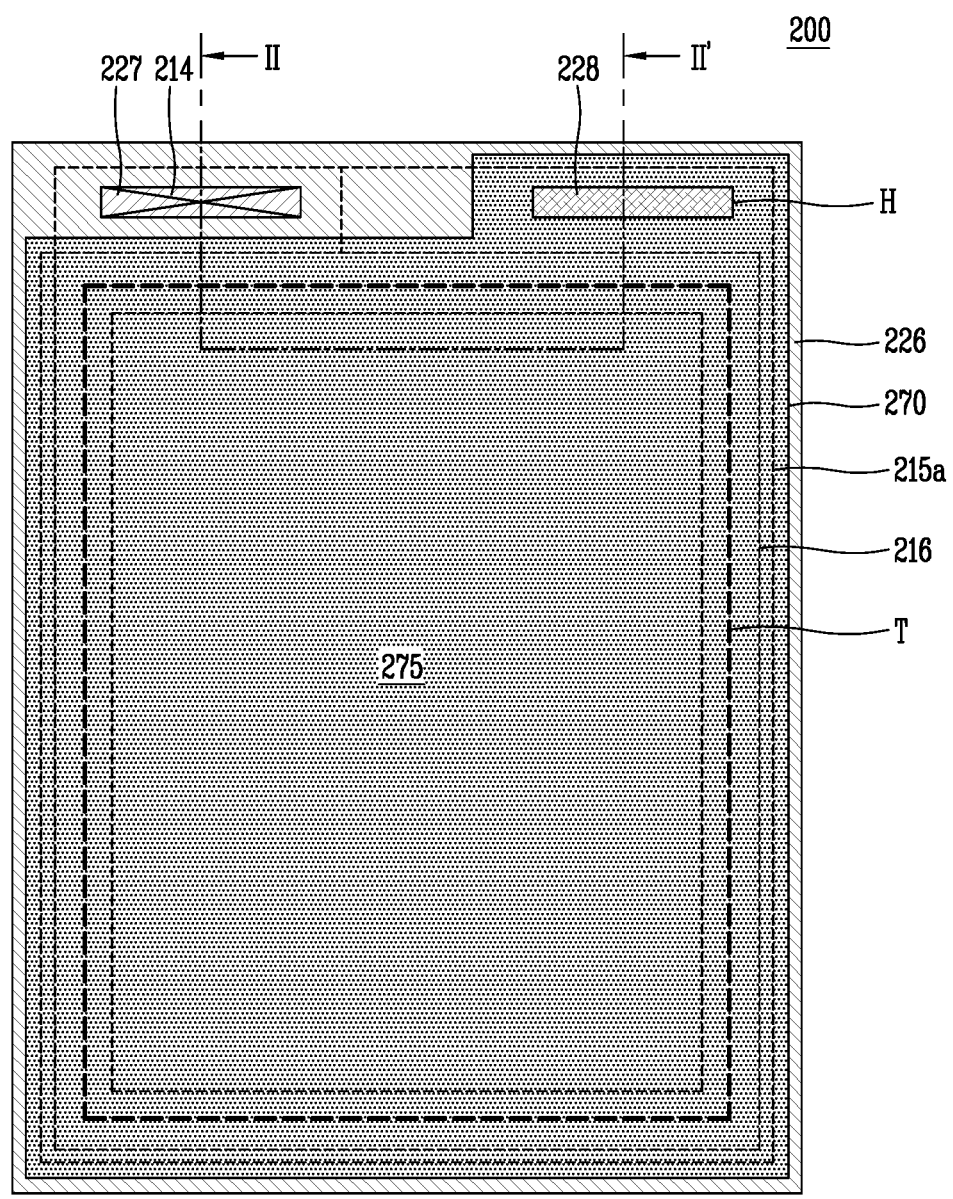
FIG. 10 is a plan view schematically showing a lighting apparatus using an organic light-emitting diode according to another exemplary aspect of the present disclosure.
Figure 11:
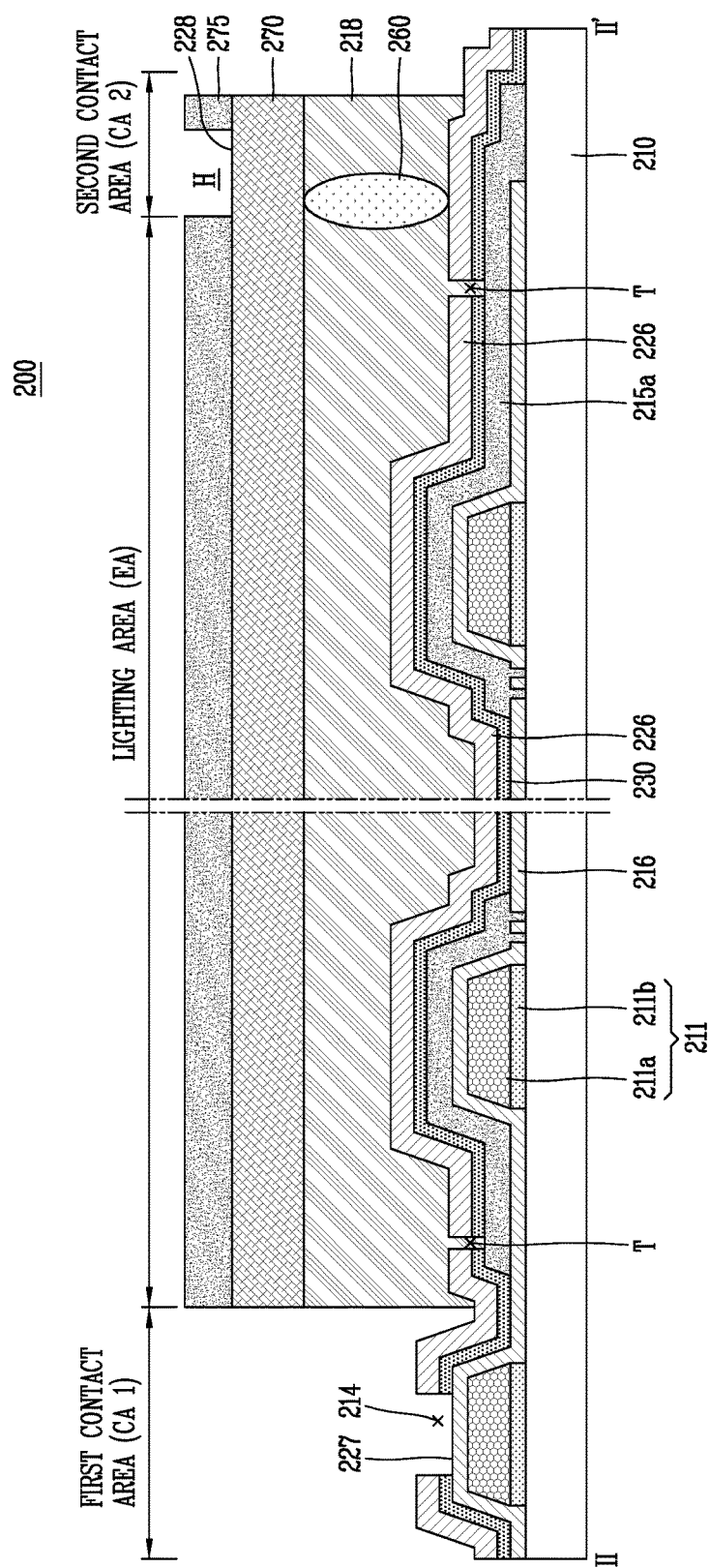
FIG. 11 is a schematic cross-sectional view of the lighting apparatus using an organic light-emitting diode according to another exemplary aspect of the present disclosure, taken along line II-II' of FIG. 10.

FIG. 10 is a plan view schematically showing a lighting apparatus using an organic light-emitting diode according to another exemplary aspect of the present disclosure;

FIG. 11 is a schematic cross-section view of the lighting apparatus using an organic light-emitting diode according to another exemplary aspect of the present disclosure, taken along line II-II' of FIG. 10.

The lighting apparatus using an organic light-emitting diode according to another exemplary aspect of the present disclosure, shown in FIGS. 10 and 11, have substantially the same components as the lighting apparatus using an organic light-emitting diode according to the foregoing exemplary aspect of the present disclosure, except for the protective film.

That is, a lighting apparatus using an organic light-emitting diode according to another exemplary aspect of the present disclosure may include an organic light-emitting diode part where surface emission occurs, and a sealing part that seals the organic light-emitting diode part.

The organic light-emitting diode part is made up of organic light-emitting diodes placed on the substrate. Referring to FIGS. 10 and 11, the substrate 210 may be divided into a lighting area EA that actually emits light and sends it out, and contact areas CA1 and CA2 that are electrically connected externally via contact electrodes 227 and 228 and apply signals to the lighting area EA.

The contact areas CA1 and CA2 may be electrically connected externally via the contact electrodes 227 and 228 as they are not covered by a metal film 270, used as a sealing means, and/or a protective film 275. The first contact electrode 227 is electrically connected externally as it is exposed via a contact hole 214, and the second contact electrode 228, formed from a portion of the metal film 270, may be electrically connected externally as it is exposed via an open hole H formed in the protective film 275.

The contact areas CA1 and CA2 may be located outside the lighting area EA. For example, referring to FIG. 10, the contact areas CA1 and CA2 are located outside the upper part of the lighting area EA—that is, the first contact area CA1 may be located on the left side, and the second contact area CA2 may be located on the right side. This makes the module process easy. However, the present disclosure is not limited to this configuration. The metal film 270 may be attached to the entire surface of the lighting area EA and second contact area CA2 of the substrate 210, but not to the first contact area CA1, and the protective film 275 may be attached to the entire surface of the lighting area EA of the substrate 110 and the second contact area CA2, but not to the first contact area CA1 and the open hole H.

An organic light-emitting diode is formed by a first electrode 216 and a second electrode 226 positioned on the substrate 210 and an organic emissive layer 230 situated between the first and second electrodes 216 and 226.

In this case, a trench T exposing a passivation layer 215a may be formed along the edge of the lighting area EA by removing the organic emissive layer 230 and the second electrode 226. The trench T is formed in the shape of a closed curve along the edge of the lighting area EA, and functions to prevent moisture from penetrating the organic emissive layer 230 in the lighting area EA.

Referring to FIG. 10, the trench T of this disclosure may be formed in the shape of an overall rectangular frame, but the present disclosure is not limited to this shape.

The trench T may separate (break or cut) the organic emissive layer 230 along the edge of the lighting area EA, thereby preventing moisture from spreading into the lighting area EA along the organic emissive layer 230. In particular, the trench T of this disclosure may simplify the process by laser ablation without using any photolithography process.

In this case, the first electrode 216 including the first contact electrode 227 is positioned on the substrate 210 made of transparent material. The substrate 210, although may be made of hard material such as glass, may be made of flexible material such as plastic to make the lighting apparatus 200 bendable. Moreover, the present disclosure allows for roll-to-roll processing by using a flexible plastic material as the substrate 210, thus enabling rapid fabrication of the lighting apparatus 200.

The first electrode 216 including the first contact electrode 227 is formed in the lighting area EA and the first contact area CA1, and may be made of transparent conductive material with a high work function.

The first electrode 216 may extend to the first contact area CA1 outside the lighting area EA and constitute the first contact electrode 227.

An auxiliary electrode 211 may be placed in the lighting area EA and first contact area CA1 of the substrate 210 and electrically connected to the first electrode 216.

The auxiliary electrode 211 is positioned across the entire lighting area EA, in the shape of a matrix of thin lines, a mesh, a hexagon, an octagon, or a circle so that an electric current is evenly applied to the first electrode 216 over the entire lighting area EA, thus enabling the large-area lighting apparatus 200 to emit light with uniform brightness.

Although FIG. 11 illustrates an example where the auxiliary electrode 211 is positioned below the first electrode 216 including the first contact electrode 227, the present disclosure is not limited to this example, and the auxiliary electrode 211 may be positioned over the first electrode 216 including the first contact electrode 227. The auxiliary electrode 211 placed in the first contact area CA1 may be used as a current transfer path to the first electrode 216, and also may function as a contact electrode that comes into contact with the outside and applies an external current to the first electrode 216.

The auxiliary electrode 211 may be made of a metal with high conductivity, such as Al, Au, Cu, Ti, W, Mo, or an alloy thereof. The auxiliary electrode 211 may have a two-layer structure of an upper auxiliary electrode 211a and a lower auxiliary electrode 211b, but the present disclosure is not limited to this structure, and the auxiliary electrode 211 may consist of a single layer.

The passivation layer 215a may be stacked in the lighting area EA and second contact area CA2 of the substrate 210. Although FIG. 10 illustrates that the passivation layer 215a is in the shape of a rectangular frame of a certain width, the present disclosure is not limited to this shape.

The passivation layer 215a in the lighting area EA is configured to cover the auxiliary electrode 211 and the overlying first electrode 216, but the passivation layer 215a is not formed in the light-emission area where light is actually emitted. In particular, the passivation layer 215a in the lighting area EA reduces the difference in level caused by the auxiliary electrode 211 as it surrounds the auxiliary electrode 211, which allows for stable formation of various layers that are to be formed later, without separation.

The passivation layer 215a may be made of an inorganic material such as SiOx or SiNx. Alternatively, the passivation layer 215a may be made of an organic material such as photoacryl or be made of a plurality of layers of inorganic and organic materials.

Like the foregoing exemplary aspect of the present disclosure, the lighting apparatus 200 using an organic light-emitting diode according to another exemplary aspect of the present disclosure is characterized in that the organic emissive layer 230 and the second electrode 226 are positioned on the entire surface of the substrate 210 where the first electrode 216 and the passivation layer 215a are placed.

That is, the lighting apparatus 200 using an organic light-emitting diode according to another exemplary aspect of the present disclosure is characterized in that the organic emissive layer 230 and the second electrode 226 are deposited on the entire surface, without using an open mask, which is a separate, complicated tool, and then the organic emissive layer 230 in the lighting area EA and contact areas CA1 and CA2 becomes separated (broken or cut) by laser ablation, and at the same time, the contact hole 214 for contact with the anode is formed.

In this case, the trench T is formed by removing the organic emissive layer 230 and second electrode 226 from the edge of the lighting area EA of the substrate 210 by laser ablation. Hereupon, the surface of the first passivation layer 215a may be exposed via the trench T.

Moreover, the contact hole 214 exposing the first contact electrode 227 may be formed by removing a certain part of the organic emissive layer 230 and second electrode 226 in the first contact area CA1 of the substrate 210 by laser ablation.

As such, the first contact electrode 227 may be formed from the first electrode 216 or as an additional electrode (not shown), and the second contact electrode 228 may be formed from the metal film 270.

As described above, the organic emissive layer 230 is a white organic emissive layer, and may be made up of blue, red, and green emitting layers or be made up of a blue emitting layer and a yellow-green emitting layer stacked in tandem. Moreover, the organic emissive layer 230 may include an electron injection layer and a hole injection layer that respectively inject electrons and holes into the emitting layers, an electron transport layer and a hole transport layer that respectively transport the injected electrons and holes to the emitting layers, and a charge generating layer that generates electric charges such as electrons and holes.

The second electrode 226 may be made of metal, such as Al, Mo, Cu, and Ag, or an alloy such as MoTi.

An adhesive 218 such as PSA (pressure sensitive adhesive) is applied to the lighting area EA and second contact area CA2 of the substrate 210 where the second electrode 226 is formed, and the metal film 270 is positioned over the adhesive 218 so that the metal film 270 is attached to the substrate 210 to seal the lighting apparatus 200.

Then, a given protective film 275 may be attached onto the metal film 270. In another exemplary aspect of the present disclosure, instead of forming the protective film 275 in the second contact area CA2, an open hole H may be formed to expose part of the second contact electrode 228. In this case, the second contact electrode 228 is less exposed externally compared to the foregoing exemplary aspect of the present disclosure, thereby minimizing external effects such as corrosion.

The adhesive 218 may be a light curing adhesive or a heat curing adhesive.

The adhesive 218 according to another exemplary aspect of the present disclosure contains conductive particles 260, and the metal film 270 including the second contact electrode 228 is electrically connected to the second electrode 226 by the conductive particles 260.

The conductive particles 260 may be nickel, carbon, solder balls, etc.

As described above, in the first contact area CA1 of the substrate 210, the first contact electrode 227 connected to the first electrode 216 may be exposed externally via the contact hole 214. The second contact electrode 228 may be formed from a portion of the metal film 270 and exposed externally via the open hole H, and the second contact electrode 228 may be electrically connected to the second electrode 226 by the conductive particles 260 in the adhesive 218. Thus, the first contact electrode 227 and the second contact electrode 228 are electrically connected to an external power source to apply an electrical current to the first electrode 216 and the second electrode 226, respectively.

Moreover, as described above, in the present disclosure, the organic emissive layer 230 and the second electrode 226 are stacked on the entire surface of the substrate 210, and the trench T is formed by laser ablation to separate the organic emissive layer 230, thereby preventing moisture from penetrating and spreading into the organic emissive layer 230 in the lighting area EA.

As described above, a given conductive layer may be formed in the contact hole, and an electrical connection to the first contact electrode may be made through the conductive layer, which will be described in detail with respect to still another exemplary aspect of the present disclosure.

Figure 12:
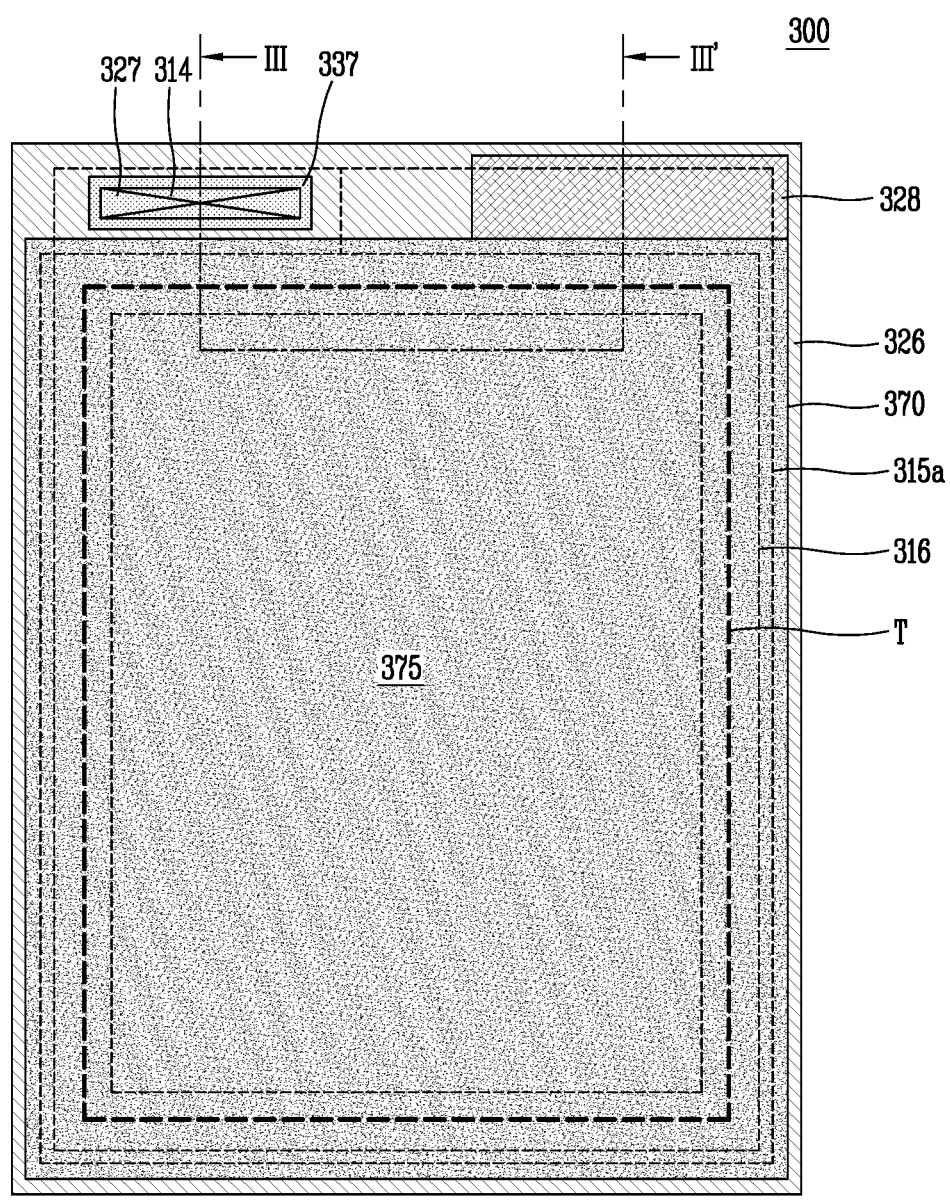
FIG. 12 is a plan view schematically showing a lighting apparatus using an organic light-emitting diode according to still another exemplary aspect of the present disclosure.

FIG. 12 is a plan view schematically showing a lighting apparatus using an organic light-emitting diode according to still another exemplary aspect of the present disclosure.

Figure 13:
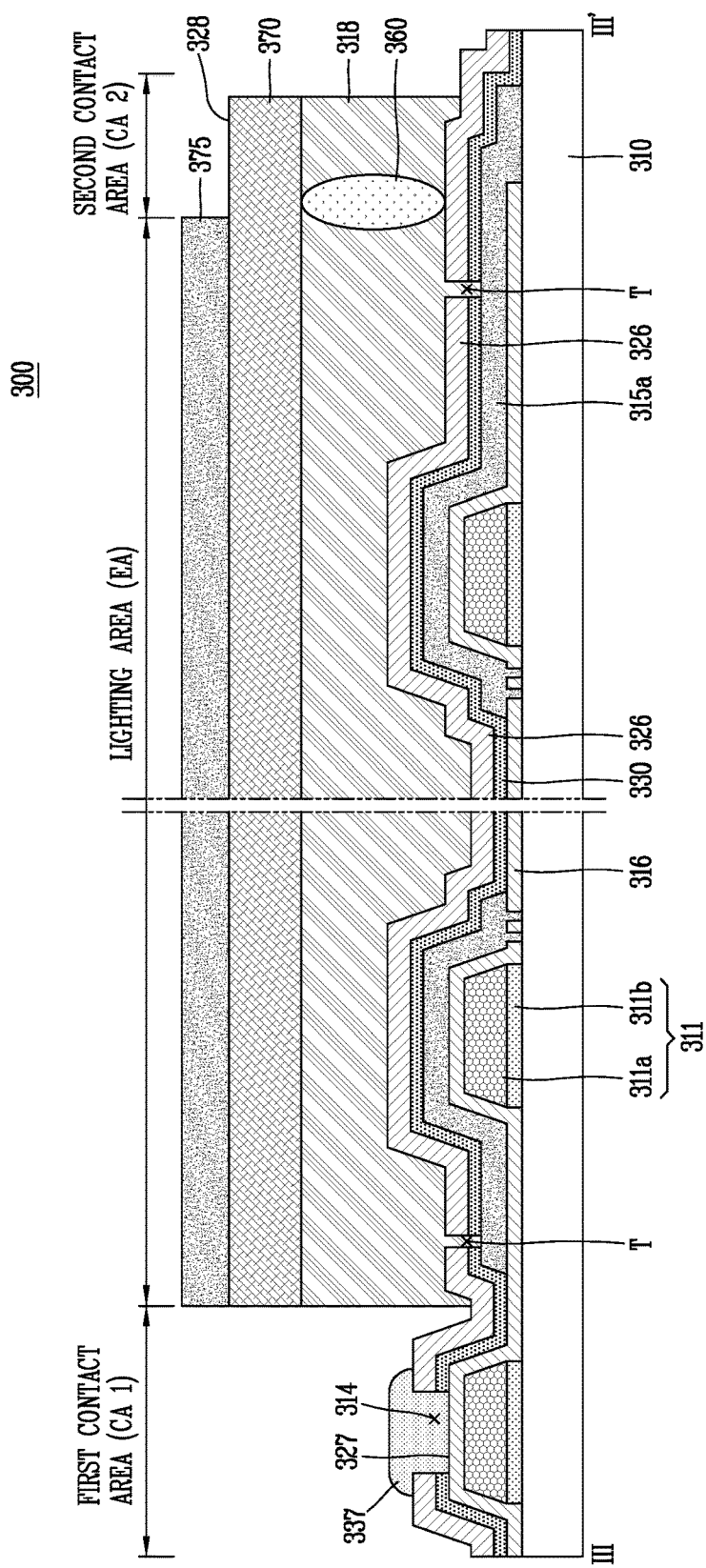
FIG. 13 is a schematic cross-sectional view of the lighting apparatus using an organic light-emitting diode according to still another exemplary aspect of the present disclosure, taken along line III-III' of FIG. 12.

FIG. 13 is a schematic cross-section view of the lighting apparatus using an organic light-emitting diode according to still another exemplary aspect of the present disclosure, taken along line III-III' of FIG. 12.

The lighting apparatus using an organic light-emitting diode according to still another exemplary aspect of the present disclosure, shown in FIGS. 12 and 13, have substantially the same components as the lighting apparatus using an organic light-emitting diode according to the foregoing exemplary aspects of the present disclosure, except that a conductive layer is additionally formed in the first contact area.

That is, a lighting apparatus using an organic light-emitting diode according to still another exemplary aspect of the present disclosure may include an organic light-emitting diode part where surface emission occurs, and a sealing part that seals the organic light-emitting diode part.

The organic light-emitting diode part is made up of organic light-emitting diodes placed on the substrate. Referring to FIGS. 12 and 13, the substrate 310 may be divided into a lighting area EA that actually emits light and sends it out, and contact areas CA1 and CA2 that are electrically connected externally via contact electrodes 327 and 328 and apply signals to the lighting area EA. In still another exemplary aspect of the present disclosure, the first contact electrode 327 may be electrically connected externally through a conductive film 337 formed in a contact hole 314.

The contact areas CA1 and CA2 may be electrically connected externally via the contact electrodes 327 and 328 as they are not covered by a metal film 370, used as a sealing means, and/or a protective film 375. The first contact electrode 327 is electrically connected externally as it is connected to the overlying conductive film 338 via the contact hole 314, and the second contact electrode 328, formed from a portion of the metal film 370, may be exposed and electrically connected externally.

The contact areas CA1 and CA2 may be located outside the lighting area EA. For example, referring to FIG. 12, the contact areas CA1 and CA2 are located outside the upper part of the lighting area EA—that is, the first contact area CA1 may be located on the left side, and the second contact area CA2 may be located on the right side. This makes the module process easy. However, the present disclosure is not limited to this configuration. The metal film 370 may be attached to the entire surface of the lighting area EA and second contact area CA2 of the substrate 310, but not to the first contact area CA1, and the protective film 375 may be attached to the entire surface of the lighting area EA of the substrate 310, but not to the first and second contact areas CA1 and CA2.

An organic light-emitting diode is formed by a first electrode 316 and a second electrode 326 positioned on the substrate 310 and an organic emissive layer 330 situated between the first and second electrodes 316 and 326.

In this case, a trench T exposing a passivation layer 315a may be formed along the edge of the lighting area EA by removing the organic emissive layer 330 and the second electrode 326. The trench T is formed in the shape of a closed curve along the edge of the lighting area EA, and functions to prevent moisture from penetrating the organic emissive layer 330 in the lighting area EA.

Referring to FIG. 12, the trench T of this disclosure may be formed in the shape of an overall rectangular frame, but the present disclosure is not limited to this shape.

The trench T may separate (break or cut) the organic emissive layer 330 along the edge of the lighting area EA, thereby preventing moisture from spreading into the lighting area EA along the organic emissive layer 330. In particular, the trench T of this disclosure may simplify the process by laser ablation without using any photolithography process.

In this case, the first electrode 316 including the first contact electrode 327 is positioned on the substrate 310 made of transparent material. The substrate 310, although may be made of hard material such as glass, may be made of flexible material such as plastic to make the lighting apparatus 300 bendable. Moreover, the present disclosure allows for roll-to-roll processing by using a flexible plastic material as the substrate 310, thus enabling rapid fabrication of the lighting apparatus 300

The first electrode 316 including the first contact electrode 327 is formed in the lighting area EA and the first contact area CA1, and may be made of transparent conductive material with a high work function.

The first electrode 316 may extend to the first contact area CA1 outside the lighting area EA and constitute the first contact electrode 327.

An auxiliary electrode 311 may be placed in the lighting area EA and first contact area CA1 of the substrate 310 and electrically connected to the first electrode 316.

The auxiliary electrode 311 is positioned across the entire lighting area EA, in the shape of a matrix of thin lines, a mesh, a hexagon, an octagon, or a circle so that an electric current is evenly applied to the first electrode 316 over the entire lighting area EA, thus enabling the large-area lighting apparatus 300 to emit light with uniform brightness.

Although FIG. 13 illustrates an example where the auxiliary electrode 311 is positioned below the first electrode 316 including the first contact electrode 327, the present disclosure is not limited to this example, and the auxiliary electrode 311 may be positioned over the first electrode 316 including the first contact electrode 327. The auxiliary electrode 311 placed in the first contact area CA1 may be used as a current transfer path to the first electrode 316, and also may function as a contact electrode that comes into contact with the outside and applies an external current to the first electrode 316.

The auxiliary electrode 311 may be made of a metal with high conductivity, such as Al, Au, Cu, Ti, W, Mo, or an alloy thereof. The auxiliary electrode 311 may have a two-layer structure of an upper auxiliary electrode 311a and a lower auxiliary electrode 311b, but the present disclosure is not limited to this structure, and the auxiliary electrode 311 may consist of a single layer.

The passivation layer 315a may be stacked in the lighting area EA and second contact area CA2 of the substrate 310. Although FIG. 12 illustrates that the passivation layer 315a is in the shape of a rectangular frame of a certain width, the present disclosure is not limited to this shape.

The passivation layer 315a in the lighting area EA is configured to cover the auxiliary electrode 311 and the overlying first electrode 316, but the passivation layer 315a is not formed in the light-emission area where light is actually emitted. In particular, the passivation layer 315a in the lighting area EA reduces the difference in level caused by the auxiliary electrode 311 as it surrounds the auxiliary electrode 311, which allows for stable formation of various layers that are to be formed later, without separation.

The passivation layer 315a may be made of an inorganic material such as $SiO_x$ or $SiN_x$. Alternatively, the passivation layer 315a may be made of an organic material such as photoacryl or be made of a plurality of layers of inorganic and organic materials.

Like the foregoing exemplary aspects of the present disclosure, the lighting apparatus 300 using an organic light-emitting diode according to still another exemplary aspect of the present disclosure is characterized in that the organic emissive layer 330 and the second electrode 326 are positioned on the entire surface of the substrate 310 where the first electrode 316 and the passivation layer 315a are placed.

That is, the lighting apparatus 300 using an organic light-emitting diode according to still another exemplary aspect of the present disclosure is characterized in that the organic emissive layer 330 and the second electrode 326 are deposited on the entire surface, without using an open mask, which is a separate, complicated tool, and then the organic emissive layer 330 in the lighting area EA and the contact areas CA1 and CA2 becomes separated (broken or cut) by laser ablation, and at the same time, the contact hole 314 for contact with the anode is formed.

In this case, the trench T is formed by removing the organic emissive layer 330 and second electrode 326 from the edge of the lighting area EA of the substrate 310 by laser ablation. Hereupon, the surface of the first passivation layer 315a may be exposed via the trench T.

Moreover, the contact hole 314 exposing the first contact electrode 327 may be formed by removing a certain part of the organic emissive layer 330 and second electrode 326 in the first contact area CA1 of the substrate 310 by laser ablation.

As such, the first contact electrode 327 may be formed from the first electrode 316 or as an additional electrode (not shown), and the second contact electrode 328 may be formed from the metal film 370.

As described above, the organic emissive layer 330 is a white organic emissive layer, and may be made up of blue, red, and green emitting layers or be made up of a blue emitting layer and a yellow-green emitting layer stacked in tandem. Moreover, the organic emissive layer 330 may include an electron injection layer and a hole injection layer that respectively inject electrons and holes the emitting layers, an electron transport layer and a hole transport layer that respectively transport the injected electrons and holes to the emitting layers, and a charge generating layer that generates electric charges such as electrons and holes.

The second electrode 326 may be made of metal, such as Al, Mo, Cu, and Ag, or an alloy such as MoTi.

An adhesive 318 such as PSA (pressure sensitive adhesive) is applied to the lighting area EA and the second contact area CA2 of the substrate 310 where the second electrode 326 is formed, and the metal film 370 is positioned over the adhesive 318 so that the metal film 370 is attached to the substrate 310 to seal the lighting apparatus 300.

Then, a protective film 375 may be attached onto the metal film 370.

The adhesive 318 may be a light curing adhesive or a heat curing adhesive.

The adhesive 318 according to still another exemplary aspect of the present disclosure contains conductive particles 360, and the metal film 370 including the second contact electrode 328 is electrically connected to the second electrode 326 by the conductive particles 360.

The conductive particles 360 may be nickel, carbon, solder balls, etc.

As described above, the conductive film 337 is formed in the first contact area CA1 of the substrate 310, and the conductive film 337 may be electrically connected to the first contact electrode 327 via the contact hole 314. The conductive film 337 may be formed in the contact hole 314 and over the second electrode 326 in the second contact area CA2 by an Ag printing process, for example. However, the present disclosure is not limited to the aforementioned printing process, and a variety of methods such as a screen printing or an inject printing.

The second contact electrode 328 may be formed from a portion of the metal film 370 and exposed externally, and the second contact electrode 328 may be electrically connected to the second electrode 326 by the conductive particles 360 in the adhesive 318. Thus, the first contact electrode 327 and the second contact electrode 328 are electrically connected to an external power source to apply an electrical current to the first electrode 316 and the second electrode 326, respectively.

Moreover, as described above, in the present disclosure, the organic emissive layer 330 and the second electrode 326 are stacked on the entire surface of the substrate 310, and the trench T is formed by laser ablation to separate the organic emissive layer 330, thereby preventing moisture from penetrating and spreading into the organic emissive layer 330 in the lighting area EA.

Although the above description contains specific examples, these should not be construed as limiting the scope of the disclosure, but as merely providing illustrations of the aspects of this disclosure. Therefore, the scope of the disclosure is defined not by the detailed description, but by the claims and their equivalents.

What is claimed is:

1. A lighting apparatus using an organic light-emitting diode, comprising:
   a substrate having a lighting area and first and second contact areas;
   a first electrode on the substrate;
   a passivation layer on the first electrode;
   an organic emissive layer on the substrate including the passivation layer;
   a second electrode on the passivation layer;
   a trench disposed along a peripheral of the lighting area and disconnecting the organic emissive layer in the lighting area from the organic emissive layer in the first and second contact areas; and
   a metal film disposed over the substrate in the lighting area and the second contact area.

2. The lighting apparatus of claim 1, wherein the first and second contact areas are located outside the lighting area.

3. The lighting apparatus of claim 1, further comprising a first contact electrode disposed in the first contact area and extended from the first electrode in the lighting area.

4. The lighting apparatus of claim 3, further comprising a contact hole exposing the first contact electrode by removing the organic emissive layer and the second electrode in the first contact area.

5. The lighting apparatus of claim 4, further comprising a conductive film in the contact hole in the first contact area, and electrically contacts the first contact electrode via the contact hole.

6. The lighting apparatus of claim 1, further comprising a second contact electrode disposed in the second contact area and extended from the metal film in the lighting area.

7. The lighting apparatus of claim 6, further comprising a protective film disposed on the metal film in the lighting area.

8. The lighting apparatus of claim 7, wherein the protective film has an open hole exposing the second contact electrode.

9. The lighting apparatus of claim 1, further comprising an adhesive attached to the metal film.

10. The lighting apparatus of claim 9, wherein the adhesive has conductive particles, so that the metal film is electrically connected to the second electrode through the conductive particles.

11. The lighting apparatus of claim 10, wherein the conductive particles include nickel, carbon, or solder balls.

12. The lighting apparatus of claim 1, wherein the organic emissive layer and the second electrode are exposed to outside the apparatus through an outermost side of the substrate.

13. A method of fabricating a lighting apparatus using an organic light-emitting diode, the method comprising:
    forming a first electrode on a substrate having a lighting area and first and second contact areas;
    forming a passivation layer on the substrate including the first electrode;
    forming an organic emissive layer on the passivation layer;
    forming a second electrode on the passivation;
    forming a trench by removing portions of the organic emissive layer and the second electrode from a periphery of the lighting area, the trench disconnecting the organic emissive layer in the lighting area from the organic emissive layer in the first and second contact areas; and
    attaching a metal film over the substrate in the lighting area and the second contact area, with an adhesive in between.

14. The method of claim 13, wherein the first electrode in the lighting area extends to the first contact area to be a first contact electrode.

15. The method of claim 14, further comprising, when forming the trench, simultaneously forming a contact hole exposing the first contact electrode by removing portions of the organic emissive layer and the second electrode in the first contact area.

16. The method of claim 15, further comprising forming a conductive film in the contact hole in the first contact area, the conductive film being electrically connected to the first contact electrode via the contact hole.

17. The method of claim 13, wherein the metal film in the second contact area extends to the second contact area to be a second contact electrode.

18. The method of claim 17, further comprising forming a protective film onto the metal film in the lighting area.

19. The method of claim 17, further comprising forming a protective film on the metal film in the lighting area and the second contact area, and forming an open hole in the protective film in the second contact area to expose the second contact electrode.

20. The method of claim 13, wherein the adhesive has conductive particles, so that the metal film is electrically connected to the second electrode through the conductive particles.

* * * * *